(12) United States Patent
Taniguchi et al.

(10) Patent No.: US 6,897,963 B1
(45) Date of Patent: May 24, 2005

(54) STAGE DEVICE AND EXPOSURE APPARATUS

(75) Inventors: Tetsuo Taniguchi, Ageo (JP); Saburo Kamiya, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/593,800

(22) Filed: Jun. 15, 2000

Related U.S. Application Data

(63) Continuation of application No. PCT/JP98/05705, filed on Dec. 17, 1998.

(30) Foreign Application Priority Data

Dec. 18, 1997 (JP) .............................................. 9-364493
Nov. 30, 1998 (JP) ........................................... 10-339789

(51) Int. Cl.[7] .................................................. G01B 9/02
(52) U.S. Cl. ...................................... 356/500; 356/508
(58) Field of Search ................................ 356/500, 508, 356/509, 486, 487

(56) References Cited

U.S. PATENT DOCUMENTS

| | | | | |
|---|---|---|---|---|
| 3,941,480 A | * | 3/1976 | Webster et al. | 356/106 R |
| 4,265,542 A | * | 5/1981 | Snow | 356/356 |
| 4,332,473 A | * | 6/1982 | Ono | 356/356 |
| 4,984,891 A | * | 1/1991 | Miyazaki et al. | 356/500 |
| 5,506,684 A | * | 4/1996 | Ota et al. | 356/401 |
| 5,523,841 A | * | 6/1996 | Nara et al. | 356/358 |
| 5,523,843 A | * | 6/1996 | Yamane et al. | 356/500 |
| 5,677,758 A | | 10/1997 | McEachern et al. | |
| 5,784,166 A | * | 7/1998 | Sogard | 356/363 |
| 6,084,673 A | | 7/2000 | Van Den Brink et al. | |
| 6,211,965 B1 | * | 4/2001 | Tsuchiya et al. | 356/493 |
| 6,341,007 B1 | | 1/2002 | Nishi et al. | |
| 6,404,505 B2 | * | 6/2002 | Matsui | 356/620 |

FOREIGN PATENT DOCUMENTS

| | | |
|---|---|---|
| EP | 0 951 054 A1 | 10/1999 |
| JP | 01030242 A * | 2/1989 |
| JP | A-4-225514 | 8/1992 |
| JP | A-6-163348 | 6/1994 |
| JP | A-7-240367 | 9/1995 |
| JP | A-7-253304 | 10/1995 |
| JP | 410214783 A * | 8/1998 |

* cited by examiner

Primary Examiner—Gregory J. Toatley, Jr.
Assistant Examiner—Patrick Connolly
(74) Attorney, Agent, or Firm—Oliff & Berridge PLC

(57) ABSTRACT

A stage device suitable for exposure apparatus used to produce semiconductor devices, is movable in an area wider than the measurement area of interferometer for position measurement, and is capable of measuring the position with high precision. When a movable stage moves from the position where the laser beams from laser interferometers are not applied into the measurement area of the laser interferometer, the position of reference mark is measured by a wafer alignment sensor, and the measurement value measured by the laser interferometer is corrected based on the results of the measurement by the wafer alignment sensor. When another movable stage enters the measurement area of the laser interferometer, the position of the reference mark is similarly measured by a wafer alignment sensor, and the measurement value measured by the laser interferometer is corrected based on the results of the measurement by the wafer alignment sensor.

20 Claims, 10 Drawing Sheets

F I G. 1
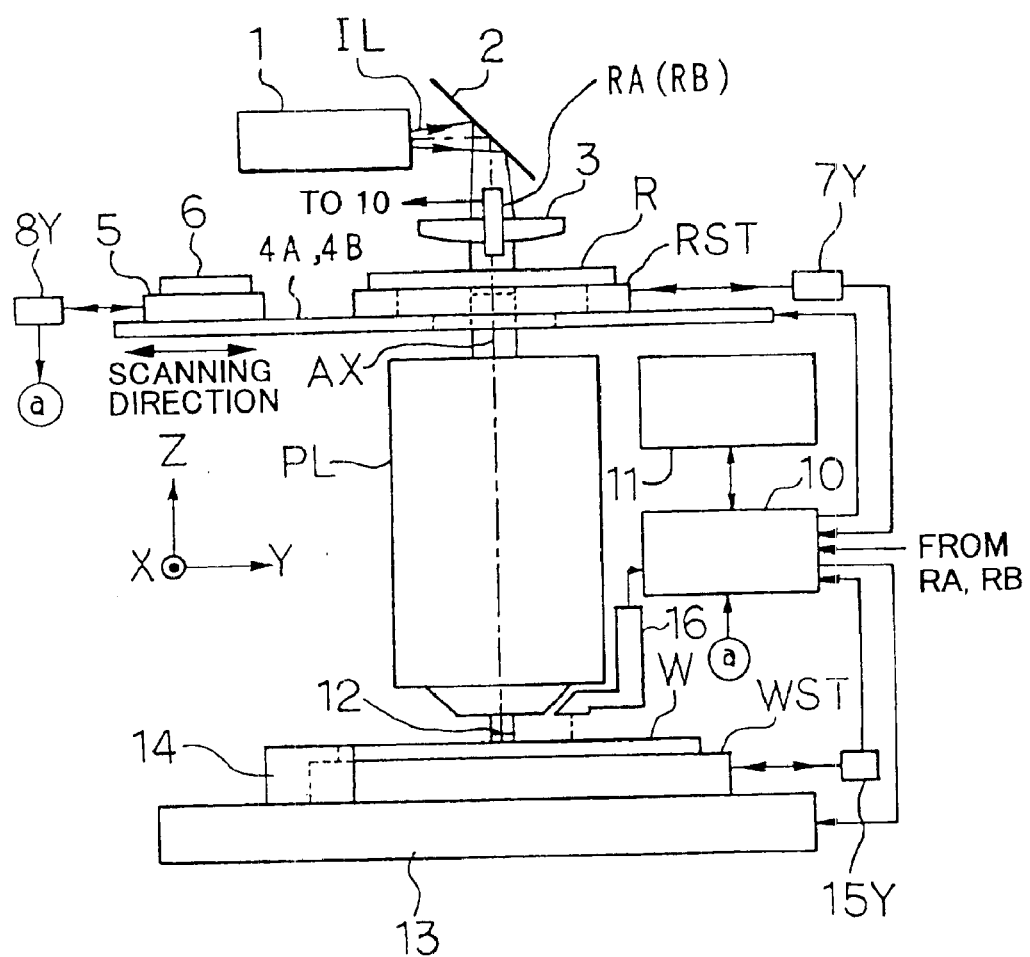

F I G. 4
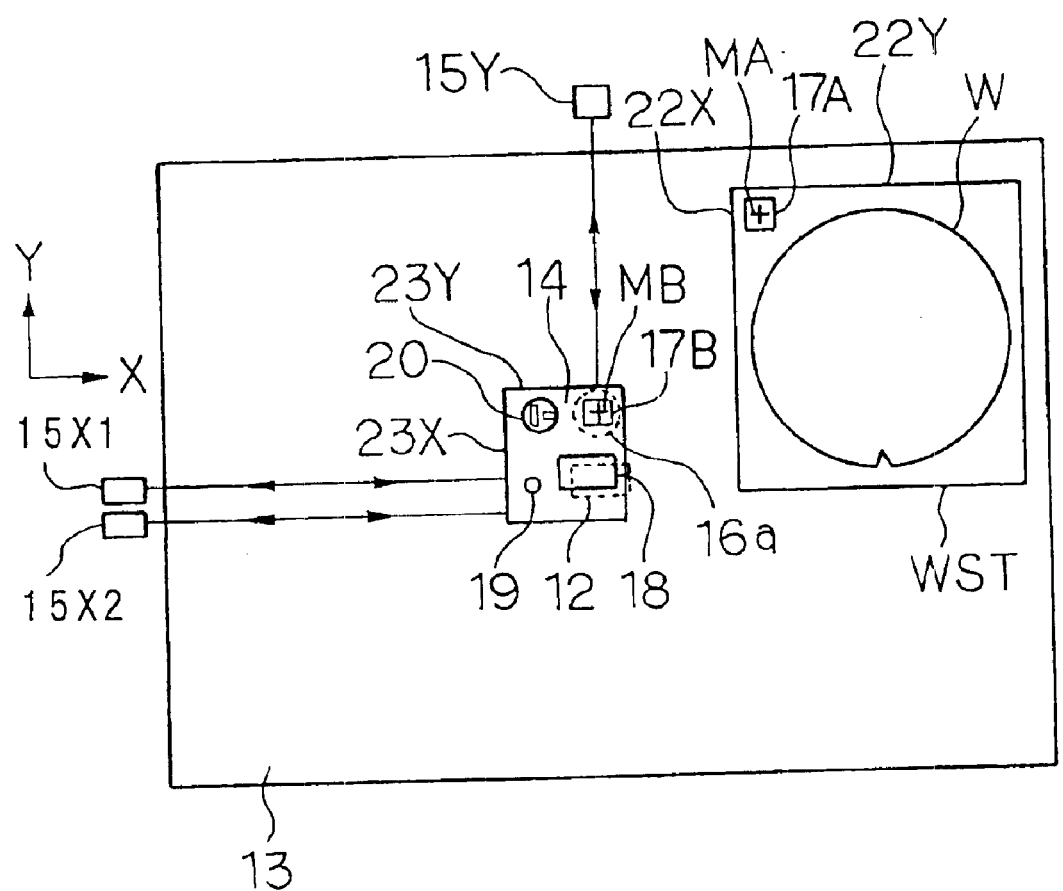

FIG. 10
(a) $|\phi 2 - \varepsilon 2| < \pi$
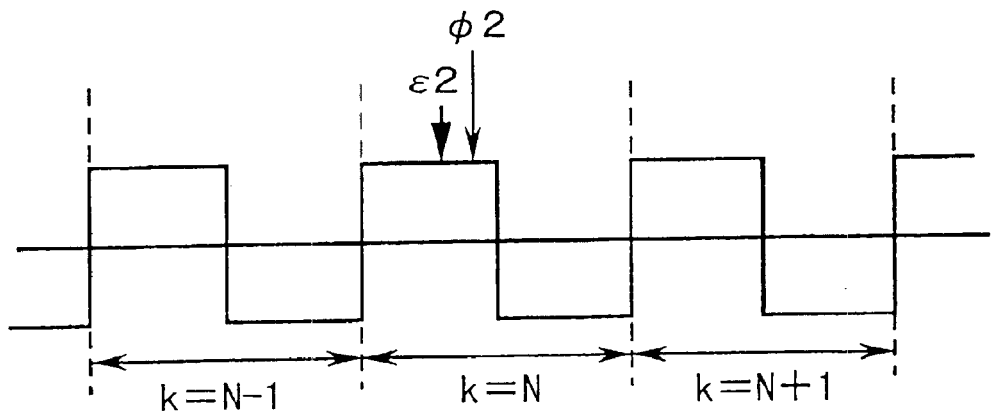
(b) $\phi 2 - \varepsilon 2 > \pi$
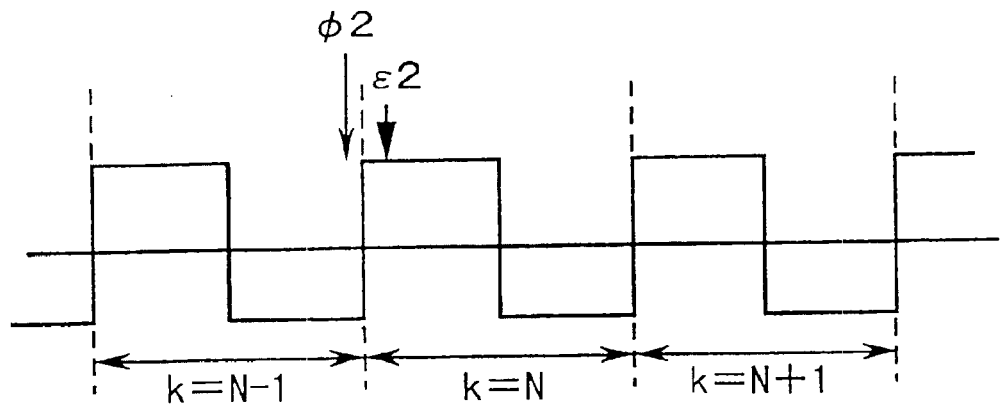
(c) $\phi 2 - \varepsilon 2 < -\pi$
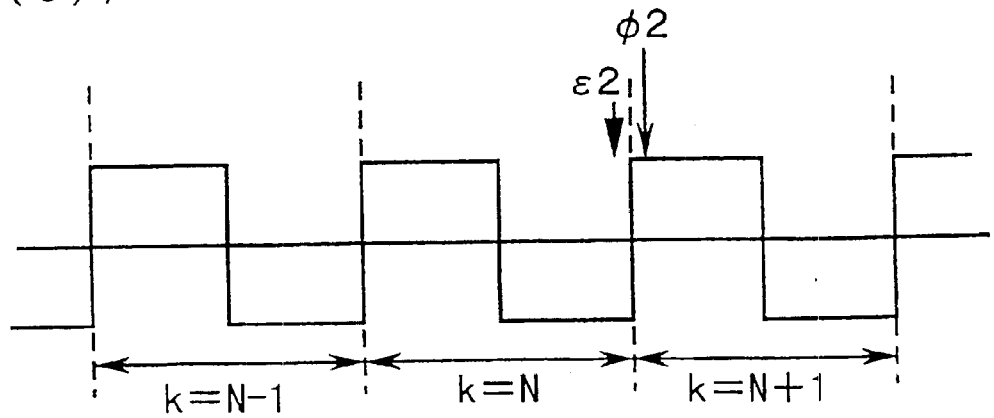

STAGE DEVICE AND EXPOSURE APPARATUS

CROSS-REFERENCE

This application is a Continuation Application of International Application No. PCT/JP98/05705 which was filed on Dec. 17, 1998 claiming the conventional priority of Japanese patent applications No. 9-364493 filed on Dec. 18, 1997 and No. 10-339789 filed on Nov. 30, 1998.

BACKGROUND OF THE INVENTION

1. Field of the invention

This invention relates to a stage device for positioning a workpiece to be machined, for example, and to an exposure apparatus equipped with this stage device and used in transferring a mask pattern onto a substrate in a lithographic process for manufacturing semiconductor devices, liquid crystal display devices, thin film magnetic heads, and so forth. The present invention is particularly suitable for use in exposure apparatus having various mechanisms such as a mechanism for measuring imaging characteristics.

2. Description of the Related Art

High exposure precision is required of a batch exposure type (stepper type) or scanning exposure type (step-and-scan type) of exposure apparatus used in the manufacture of semiconductor devices and the like. Accordingly, in the conventional exposure apparatus, a movable mirror would be fixed to the side surface of a reticle stage for carrying and positioning the reticle serving as a mask, or to that of a two-dimensionally moving wafer stage for carrying the wafer serving as a substrate, and a measurement beam would be directed at this movable mirror from an interferometer such as a laser interferometer, the result of which was that the amount of movement of the stage was continuously measured at all times, and the positioning of the stage could be carried out at high precision on the basis of the measured values. Usually, with such a stage device, interferometers on three axes have been used to measure displacement in three degrees of freedom, consisting of the two-dimensional movement component and the rotation component of the movable stage.

With such a conventional stage device, however, measurement beams from the respective interferometers had to be constantly directed at the movable mirror in all regions of the maximum movement range (movable range) of the movable stage, and because of this, the movable mirror had to be made larger than the movable range so that it would continue to reflect the measurement beams from the interferometers even if the movable stage moved.

Consequently, a large movable mirror was needed if the movable range of the movable stage was to be expanded, and this inevitably led to the overall size of the stage being larger, which was a problem in that the stage was heavier and therefore more difficult to move quickly. Also, machining a large movable mirror to the required degree of flatness entails tremendous technical difficulty, and fixing the movable mirror to the side of the movable stage without causing the mirror to bend also presents daunting technical difficulty. Unfortunately, a decrease in the flatness of the movable mirror translates directly into a decrease in positioning precision of the stage by interferometer, so ultimately there is no choice but to limit the movable range of the movable stage.

A stage device intended to solve this problem is disclosed in Japanese Patent Application Laid-Open No. 7-253304, for example. With this disclosed stage device, the number of interferometers used is greater (such as four axes) than the number of degrees of freedom in the displacement of the movable stage (such as three degrees of freedom), which allows the freedom of movement of a given stage to be measured by the remaining interferometers even if the measurement beam from one interferometer should be outside the measurement range of the movable mirror. Once the movable mirror moves back into the measurement range of this one interferometer that misses the movable mirror, the measurement values from the remaining interferometers are set as the initial value for this one interferometer, which allows the amount of movement of the movable stage to be measured by this one interferometer, and makes the movable mirror smaller than the movable range of the movable stage.

Also, with these conventional exposure apparatus, the exposure always has to be performed with the proper amount of exposure light and with the imaging characteristics maintained in a favorable state, so a measurement apparatus for measuring the state of exposure light irradiation and the like or for measuring the imaging characteristics, such as the projection magnification, is provided to the reticle stage on which the reticle is positioned or to the wafer stage on which the wafer is positioned. Examples of a measurement apparatus provided to a wafer stage include an irradiation quantity monitor for measuring the incident energy of exposure light incident to the projection optical system, and a spatial image detection system for measuring the position, contrast, etc., of a projected image. An example of a measurement apparatus provided to a reticle stage is a reference plate on which is formed an index mark used for the imaging characteristic measurement of the projection optical system.

With the above-mentioned conventional exposure apparatus, a measurement apparatus provided to the reticle stage or the wafer stage was used to achieve the proper amount of exposure and to maintain higher imaging characteristics. Nevertheless, today's exposure apparatus also need to increase the throughput (productivity) of the exposure process in the manufacture of semiconductor devices and the like. Ways of increasing throughput include increasing the exposure energy per unit of time, and raising the drive speed of the stage so as to shorten the stepping time with a batch exposure type or shorten the stepping time and the scanning exposure time with a step-and-scan type.

To thus increase the drive speed of the stage, a drive motor with a larger output is used if the size of the stage system is not to be changed, and conversely, to increase the drive speed with a drive motor of the same output as in the past, the stage system must be made more compact and lightweight. In the former case, however, the use of a drive motor with a larger output increases the amount of heat generated from the drive motor. This increase in the amount of heat causes subtle thermal deformation in the stage system, which could conceivably preclude obtaining the high positional precision required of the exposure apparatus. In view of this, the latter case, namely, making the stage system as compact and lightweight as possible, is the preferable way to increase drive speed.

Particularly with a step-and-scan type of exposure apparatus, a higher drive speed shortens the exposure scanning time and greatly improves the throughput, and another advantage is that synchronization precision between the reticle and wafer is enhanced by making the stage system more compact, as are imaging performance and alignment precision. It is difficult, however, to make the stage more compact when various measurement apparatus are provided to the reticle stage or wafer stage as in the past.

Furthermore, when a measurement apparatus for measuring the state of exposure light, imaging characteristics, or the like is provided to the reticle stage or wafer stage, a heat source such as an amp is usually attached to this measurement apparatus, and the temperature of this measurement apparatus is gradually raised by irradiation with the exposure light during measurement. As a result, there is the danger of subtle thermal deformation in the reticle stage or wafer stage and a deterioration in positioning precision, alignment precision, and so on. At present, the deterioration in positioning precision and the like caused by the elevated temperature of a measurement apparatus is slight, but as the circuit patterns of semiconductor devices and so forth become even finer in the future, the need to minimize the effect of high measurement apparatus temperatures is expected to grow.

In regard to this, the length of the movable mirror can be reduced compared to the movable range of the movable stage by using the stage device disclosed in the above-mentioned Japanese Patent Application Laid-Open No. 7-253304, but this contributes little to making the movable stage itself more compact. Therefore, another way is needed to improve throughput in the exposure step and reduce the effect of the irradiation heat of the exposure light.

In addition to improving throughput, there is also a need to improve resolution, depth of focus (DOF), line width control precision, and so forth with an exposure apparatus, and particularly a projection exposure apparatus. When the exposure wavelength is $\lambda$ and the number of apertures in the projection optical system is N.A., then the resolution R is proportional to $\lambda/\text{N.A.}$, and the depth of focus DOF is proportional to $\lambda/(\text{N.A.})^2$. Accordingly, merely reducing the exposure wavelength $\lambda$ and increasing the number of apertures N.A. in order to increase the resolution R (make the value of R smaller) results in a depth of focus DOF that is too small.

This necessitates the formation on the wafer of a pattern that combines a periodic pattern, such as a line and space (L/S) pattern, with an independent pattern, such as a contact hole (CH) pattern, in order to manufacture a device. As to periodic patterns, for instance, a technique for increasing resolution by narrowing the depth of focus by the so-called modified illumination method has recently been developed, as disclosed in Japanese Patent Application Laid-Open No. 4-225514. The phase shift reticle method has also been developed. Similarly, regarding independent patterns, a technique has been developed for substantially increasing depth of focus and the like by a method such as controlling the coherence factor of the illuminating light.

In light of these technological trends, double exposure is being given a second look as a method for increasing resolution substantially without making the depth of focus too deep. Specifically, when the double exposure method is applied, the reticle pattern used for a certain layer is split into a plurality of reticle patterns according to the type in question, and each pattern is exposed under its own optimal illumination and exposure conditions, which results in an overall broad depth of focus and a high resolution. Recently, this double exposure method has been applied to a projection exposure apparatus in which a KrF excimer laser or an ArF excimer laser is used as the exposure light, and there have been attempts at exposing a pattern for a device including an L/S pattern with a line width down to just 0.1 $\mu$m.

However, when this double exposure method is applied to a projection exposure apparatus having a single wafer stage, the alignment, exposure, and other such steps have to be repeatedly carried out in series, which is a drawback in that throughput suffers markedly. In view of this, there has been proposed a projection exposure apparatus with which alignment and exposure can be carried out in parallel. However, when a plurality of wafer stages are thus provided, if an attempt is made to measure the positions of the movable stages of the wafer stages with a single interferometer, then the measurement beam of the corresponding interferometer will be interrupted when the movable stages move a considerable distance, so when the various movable stages are positioned at the exposure position alternately, for example, it is difficult to position the movable stages quickly and with good reproducibility.

In light of the above, it is a first object of the present invention to provide a stage device having a plurality of functions, wherein the moving components are made smaller while still allowing these plurality of functions to be executed, so that these moving components can be moved quickly and their positions can be measured at high precision and with good reproducibility.

It is a second object of the present invention to provide a stage device with which the moving components can be quickly moved to their respective target positions with good reproducibility when a plurality of moving components are provided so that double exposure or another such method can be performed.

It is a third object of the present invention to provide an exposure apparatus equipped with such a stage device, with which the moving components for positioning the reticles or wafers can be made smaller while preserving the function of measuring the characteristics in the transfer of the reticle patterns, the imaging characteristics of the projection optical system, or the like.

It is a fourth object of the present invention to provide an exposure apparatus equipped with such a stage device, with which double exposure or another such method can be performed at a high throughput.

It is a fifth object of the present invention to provide a positioning method with which positioning can be carried out quickly using a stage device such as this.

It is a sixth object of the present invention to provide a stage device with which position measurement can be performed at high precision by interferometer method over a range wider than the movable mirror (or equivalent mirror surface), and as a result, the moving components can be made more compact, as well as an exposure apparatus equipped with this stage device, and a positioning method that makes use of this stage device.

It is a further object of the present invention to provide a method for manufacturing a device using the above-mentioned exposure apparatus.

SUMMARY OF THE INVENTION

The first stage device according to the present invention comprises a plurality of movable stages (WST, 14) disposed on a specific movement plane so as to be movable independently of each other; a first measurement system (15X1, 15X2, 15Y) which measures within a predetermined measurement range a position of one of the plurality of movable stages; and a second measurement system (16, 17A, 17B) which measures an amount of positional deviation of each of the plurality of movable stages from a predetermined reference position within the predetermined measurement range, or the degree of coincidence of each of the plurality of movable stages with respect to this reference position;

wherein a measurement value obtained with the first measurement system is corrected on the basis of a measurement result of the second measurement system.

With this first stage device of the present invention, when a plurality of functions such as exposure and characteristic measurement are to be executed, a plurality of movable stages (moving components) are provided, each of which is allocated to a different function (or group of a plurality of functions) of the functions. This allows each movable stage to be smaller, so it can be moved more quickly. However, if a plurality of movable stages are merely provided, and a relative displacement measurement system such as a uniaxial laser interferometer is provided as the first measurement system, then the measurement beam of the laser interferometer will be interrupted if each movable stage moves a considerable distance, so some kind of starting point setting operation is required. In view of this, with the present invention a second measurement system (16, 17A, 17B) is provided as a kind of absolute value measurement system.

When one movable stage (WST) among the plurality of movable stages enters the measurement range of the first measurement system from outside this measurement range, the amount of positional deviation of that movable stage from a predetermined reference position within the predetermined measurement range, or the degree of coincidence with respect to this reference position, is measured by the second measurement system, and this positional deviation, for example, is preset to the measurement value obtained with the first measurement system, so that the measurement value obtained with the first measurement system correctly indicates the position of this movable stage in a form with good reproducibility. Or, when the second measurement system measures the degree of coincidence (such as the coincidence of two random patterns), if this degree of coincidence is over a specific level, the measurement value of the first measurement system is reset, or is preset to a specific value. As a result, the movable stages are positioned at high precision, quickly, and with good reproducibility.

The second stage device according to the present invention comprises a plurality of movable stages (WST1, WST2) disposed in a specific movement plane so as to be movable independently of each other, and a first measurement system (87Y3) which measures within a predetermined first measurement range the position of one of the plurality of movable stages, wherein this stage device further comprises a second measurement system (87Y2, 87Y4) which continuously measures the positions of the plurality of movable stages within a predetermined second measurement range partially overlapping the first measurement range, and a control system (38) which corrects the measurement results of the first and second measurement systems on the basis of the measurement results of these two measurement systems.

With this second stage device of the present invention, a plurality of stage devices (WST1, WST2) are provided in order to perform double exposure, for example. As a result, if a uniaxial laser interferometer is used as a relative displacement measurement system, for example, then the measurement beam of this laser interferometer will miss its mark if the movable stage should move a considerable distance, so the problem is how to position the movable stages in a reproducible form. The present invention deals with this by using the uniaxial (or multiaxial) laser interferometer serving as the relative displacement measurement system as the first measurement system as well. Then, when one of the plurality of movable stages enters the second measurement range from the first measurement range, for example, the position of that movable stage is simultaneously measured by the first and second measurement systems, the measured value of the first measurement system is corrected according to the angle of rotation of that movable stage, and this corrected value is preset to the measured value of second measurement system, which transfers the measured value of the first measurement system to the second measurement system. Thereafter, that movable stage can be positioned at high precision and with good reproducibility using this second measurement system.

In this case, the first and second measurement systems may use the degrees of interference (integer) N1 and N2 and the phases (rad) $\phi 1$ and $\phi 2$ (with a heterodyne interference method these correspond to the phase difference between a reference signal and the measurement signal, for instance), and the function f($\lambda$) of the wavelength $\lambda$ of the measurement beam, to measure the position of a movable stage in the form of $f(\lambda)\{N1+\phi/(2\pi)\}$ and $f(\lambda)\{N2+\phi 2/(2\pi)\}$. When measurement with the second measurement system is possible and the position of a movable stage is measured simultaneously by the first and second measurement systems, it is preferable to estimate the degree of interference N2' and the phase $\phi 2$' of the second measurement system from the measured values of the first measurement system and the angle of rotation of the movable stage, and to determine the preset value of the degree N2 of the second measurement system from the degree N2', the phase $\phi 2$', and the phase $\phi 2$ measured by the second measurement system. From there on, the measured value of the second measurement system is treated as $f(\lambda)\{N2+\phi 2/(2\pi)\}$, so even if there is a certain amount of discrepancy in the measurement of the angle of rotation of the movable stage, the position of that movable stage can be measured at the reproducible precision inherent to the second measurement system. The function f($\lambda$) is $\lambda$/m, using an integer m of at least 2 as an example.

The first exposure apparatus according to the present invention is an exposure apparatus equipped with the stage device of the present invention, wherein masks (R1 and R2) on which mutually different patterns are formed are placed on a plurality of movable stages (RST1 and RST2) of this stage device, and the patterns of the masks on this plurality of movable stages are alternately transferred to a substrate (W1) while positioning is being performed.

With this first exposure apparatus of the present invention, exposure can be performed using the double exposure method, and resolution and depth of focus can be increased. Also, because the stage device of the present invention is used, if the position of a movable stage is to be measured by laser interferometer, for instance, the movable mirror installed on that movable stage can be smaller than the movable range of the movable stage, and this allows the movable stage to be lighter. It is therefore easier to move the movable stage quickly, and this affords a higher throughput.

The second exposure apparatus according to the present invention is an exposure apparatus equipped with the stage device of the present invention, in which a mask (R) is placed on a first movable stage (RST) of a plurality of movable stages (RST, 5) of this stage device, a characteristic measurement apparatus (6) which measures the characteristics in the transfer of a pattern of the mask is placed on a second movable stage (5), and the pattern of the mask (R) is transferred onto a substrate (W).

With this second exposure apparatus of the present invention, the first movable stage (RST) originally used for exposure is given the minimum function needed for exposure, which allows this first movable stage to be kept to the minimum required size, so the stage can be more compact and lightweight, and throughput can be increased. Meanwhile, the characteristic measurement apparatus (6) for measuring characteristics in the transfer of the pattern of the mask (R), which is not directly required for exposure, is mounted on a separate second movable stage (5), allowing characteristics to be measured in the transfer of the mask pattern. Also, the use of the stage device of the present invention allows the positions of a plurality of movable stages to be measured to high precision.

The third exposure apparatus according to the present invention is an exposure apparatus equipped with the stage device of the present invention, in which substrates (W1 and W2) are mounted on a plurality of movable stages (WST1 and WST2) of the stage device, and the plurality of substrates are alternately exposed with mask patterns while the plurality of movable stages are alternately positioned at the exposure position.

With this third exposure apparatus of the present invention, while the exposure is being carried out with one movable stage (WST1) out of the plurality of movable stages (WST1 and WST2), substrates can be conveyed in and out and aligned with the other movable stage (WST2), which increases throughput. Also, the use of the stage device of the present invention allows the positions of the plurality of movable stages to be measured to high precision.

The fourth exposure apparatus according to the present invention is an exposure apparatus equipped with the stage device of the present invention and a projection optical system (PL), in which a substrate (W) is placed on the first movable stage (WST) of the plurality of movable stages (WST, 14) of the stage device, a characteristic measurement apparatus (20) which measures the imaging characteristics of the projection optical system is placed on the second movable stage (14), and the substrate on the first movable stage is exposed with a predetermined mask pattern via the projection optical system.

With this fourth exposure apparatus of the present invention, the first movable stage (WST) originally used for exposure is given the minimum function needed for exposure, which allows this first movable stage (WST) to be more compact and lightweight and increases throughput. Meanwhile, the characteristic measurement apparatus (20) for measuring the imaging characteristics of the projection optical system, which is not directly required for exposure, is mounted on a separate second movable stage (14), so imagining characteristics can also be measured. Also, the use of the stage device of the present invention allows the positions of a plurality of movable stages to be measured to high precision.

The first positioning method according to the present invention is a positioning method that makes use of the stage device of the present invention, in which when one movable stage (WST) out of the plurality of movable stages (WST, 14) enters the measurement range of the first measurement system, the amount of positional deviation of the movable stage from a specific reference position within the specific measurement range, or the degree of coincidence with respect to this reference position, is measured by the second measurement system, and the measurement value obtained with the first measurement system is corrected on the basis of the measurement result of the second measurement system. This positioning method allows the plurality of movable stages to be positioned at high precision easily and with good reproducibility.

The second positioning method according to the present invention is a positioning method that makes use of the stage device of the present invention, in which when one movable stage out of the plurality of movable stages (WST1 and WST2) enters the first measurement range from the second measurement range, the position of the one movable stage is simultaneously measured by the first and second measurement systems, and the measurement result of the first measurement system is matched on the basis of these measurement result of the position to the measurement result of the second measurement system. This positioning method allows the plurality of movable stages to be positioned at high precision easily and with good reproducibility.

The third stage device according to the present invention is a stage device comprising a movable stage (WST2) that is movable at a predetermined degree of freedom; an interferometer system which measures an amount of displacement of the movable stage by directing a measurement light at the movable stage and causing the reflected light thereof to interfere with a reference light, in which the interferometer system has a plurality of measurement axes (92Y4 and 92Y3) of the measurement light and is disposed such that even if one (92Y4) of the plurality of measurement axes should diverge from the movable stage, the amount of displacement can still be measured by the other measurement axis (92Y5); and a signal processing system (38) with which, when the one measurement axis (92Y4) changes from the state of diverging from the movable stage to a state of irradiating the movable stage, the degree of interference of this one measurement axis is estimated from the measurement result for the other measurement axis (92Y3), and the initial value of the one measurement axis is set on the basis of the estimated degree of interference and the phase measured with the one measurement axis.

With this third stage device, the surface of the movable stage (WST2) irradiated with the measurement light is either a flat mirror surface, or a flat movable mirror (movable planar mirror) is fixed to this irradiated surface. As to the phase within one fringe of the one measurement axis, when the initial value for this one measurement axis, with which reflected light from the movable mirror (or mirror surface) can once again be obtained, is set on the basis of the interferometer principle whereby measurement can be performed with this one measurement axis itself, the interference degree and fraction of this one measurement axis are estimated from the measured value obtained for another axis, and the initial value for this one measurement axis is determined on the basis of the estimated interference degree and fraction and the phase measured for this one measurement axis (the absolute phase within one fringe).

The principle involved when the present invention is applied to a fringe count type of laser interferometer will now be described. The length Lx measured with this interferometer is expressed by the following equation.

$$Lx = (\lambda/m) \cdot (Nx + \epsilon x)$$

Here Nx is the interference degree (integer), $\epsilon x$ is the fraction obtained by dividing the phase $\phi$ by $2\pi$, $\lambda$ is the wavelength of the interferometer, and m is the number of regressions of the interferometer optical path (at a single, m=2, at a double pass, m=4). Because $\lambda$ and m are known, Nx is determined by counting the fringes according to the movement of the movable mirror, and the fraction $\epsilon x$ within one fringe can be measured at a resolution of about 1/100 by various interpolation methods. Therefore, Lx can ultimately be measured at a resolution of about $\lambda/(100 \cdot m)$. In the above-mentioned setting of the initial value for the one measurement axis, Nx is unknown because the measurement beam has diverged from the movable mirror. Nevertheless, since the fraction εx (phase) can always be measured on the one measurement axis, if the degree N is found by calculation from the measured value of another measurement axis, then the initial value of the one measurement axis can be set at a precision unique to each measurement axis.

In this case, the precision at which the measured length Lx is determined in setting the initial value from the other measurement axis should be high enough to allow the degree of interference Nx to be determined accurately, and in more specific terms should be $\pm\lambda/(2m)$ or less. Here, if the interferometer system has, for example, a plurality of measurement axes at a right angle to the above-mentioned measurement axis, the angle of rotation of the movable stage can be measured at high precision using these measurement axes. Therefore, the angle of rotation of the movable stage can be used to estimate the degree Nx of the one measurement axis at high precision from the measured value of the above-mentioned other measurement axis.

The only difference when the present invention is applied to a heterodyne interference type of laser interferometer is the way the phase is measured, and everything else is basically the same as the fringe count method. A heterodyne interference method involves integrating the change in phase (absolute phase) of the measured interference signal (measured beat signal) with respect to a reference interference signal (reference beat signal). This absolute phase corresponds to the phase φ in the fringe count method.

Next, the positioning method that makes use of the third stage device of the present invention comprises estimating the phase of the one measurement axis from the measured value of the other measurement axis in the estimation of the degree of interference of the one measurement axis from the measured value of the other measurement axis; comparing this estimated phase to the phase measured for the one measurement axis; and correcting the estimated value of the degree of interference of the one measurement axis on the basis of this comparison result. This keeps the degree of interference N from being incorrectly estimated by ±1.

The fifth exposure apparatus of the present invention is equipped with the third stage device according the invention, and positions a mask or substrate with this movable stage. With this exposure apparatus, the movable stage is more compact and can be driven at a higher speed, which increases the throughput of the exposure step.

The method of the present invention for manufacturing a device includes a step of using one of the above-mentioned exposure apparatus of the present invention to transfer the pattern of a mask onto a substrate.

BRIEF DESCRIPTION OF THE DRAWINGS

FIG. 1 is a simplified structural diagram of a projection optical system in the first embodiment of the present invention;

FIG. 4 is a plan view provided to describe the measurement of the state of exposure light or the like using the measurement stage 14 in the first embodiment;

FIGS. 10 (a)–(c) are diagrams of an example of signal processing in the interferometer system of the second embodiment of the present invention;

DESCRIPTION OF THE PREFERRED EMBODIMENT

Figure 2:
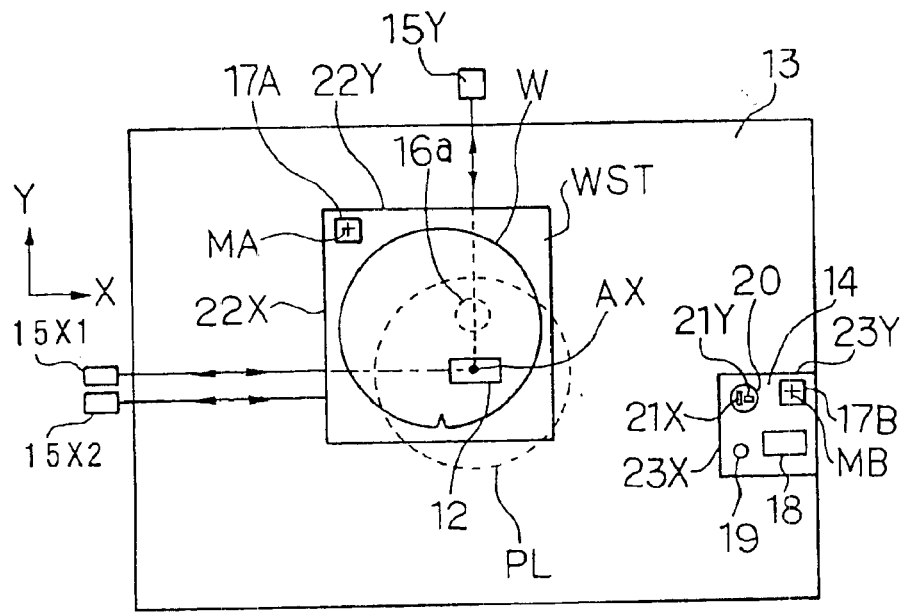
FIG. 2 is a plan view of the wafer stage WST and measurement stage 14 in FIG. 1.

A preferred first embodiment of the present invention will now be described with reference to FIGS. 1 to 4. This is an example of applying the present invention to a step-and-scan type of projection exposure apparatus.

FIG. 1 illustrates the projection exposure apparatus in this example. In FIG. 1, exposure light IL is emitted during exposure by an illumination system 1 including an exposure light source, a beam shaping optical system, a fly-eye lens for making the illumination distribution uniform, a light quantity monitor, a variable aperture stop, a field stop, a relay lens system, and so forth. This light IL illuminates a slit-shaped illumination region of the pattern side (lower side) of a reticle R via a mirror 2 and a condenser lens 3. This exposure light IL can be excimer laser light such as KrF (248 nm wavelength) or ArF (193 nm wavelength), a higher harmonic wave from a YAG laser, an i-ray from a mercury vapor lamp (365 nm wavelength), or the like. The illumination system 1 is designed so that the variable aperture stop thereof can be switched to allow selection of the desired illumination method from among ordinary illumination methods, zonal illumination, so-called deformation illumination, illumination with a small coherence factor (σ value), and the like. When the exposure light source is a laser light source, the emission timing thereof and other such factors are controlled by a main control system 10 for the general control of the operations of the apparatus as a whole via a laser light power (not shown).

The image of the pattern in the illumination region 9 (see FIG. 3) produced by illumination of this exposure light IL on the reticle R is reduced by a projection magnification β (β is ¼, ⅕, or another such factor) via the projection optical system PL, and is projected onto a slit-shaped exposure region 12 on a water W that has been coated with a photoresist. In the following description, the Z axis extends parallel to the optical axis AX of the projection optical system PL, the X axis follows a non-scanning direction perpendicular to the scanning direction of the wafer W and the reticle R during scanning exposure in a vertical plane (that is, it goes in a direction perpendicular to the viewing plane of FIG. 1), and the Y axis follows the scanning direction (that is, the direction parallel to the paper plane).

First, the reticle R is vacuum chucked to the reticle stage RST, and the reticle stage RST is placed on two guides 4A and 4B (disposed in parallel) such that it can move in the Y direction via an air bearing. In this example, the measurement stage 5 is placed on the guides 4A and 4B such that it can move in the Y direction via an air bearing independently of the reticle stage RST.

Figure 3:
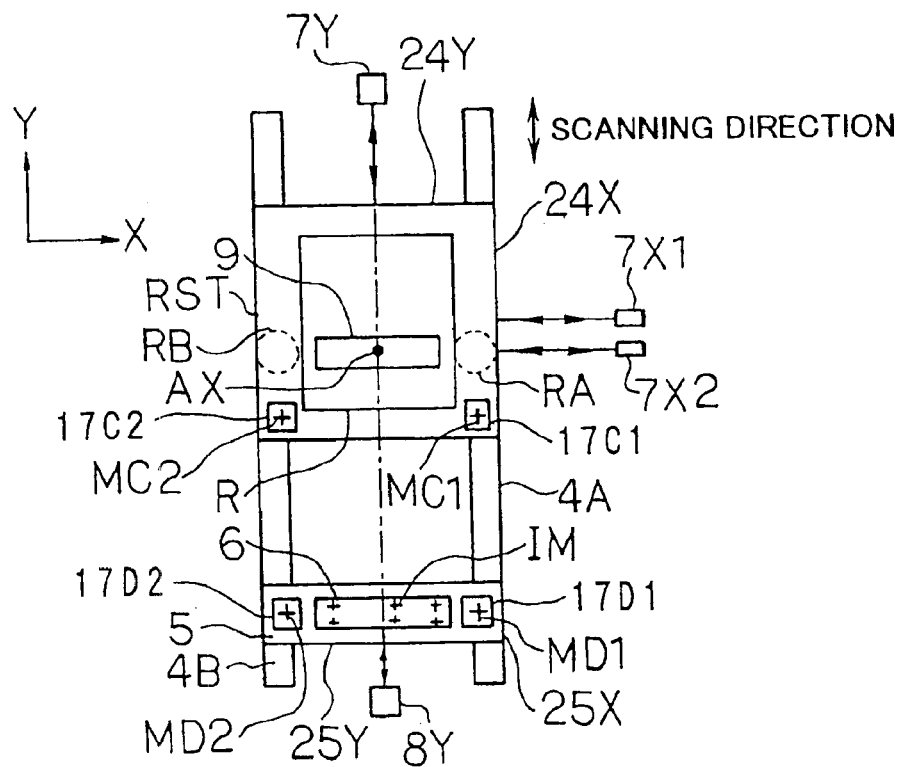
FIG. 3 is a plan view of the reticle stage RST and measurement stage 5 in FIG. 1.

FIG. 3 is a plan view of the reticle stage RST and the measurement stage 5. In FIG. 3, the reticle stage RST and the measurement stage 5 are placed so that they are each driven in the Y direction (scanning direction) by a linear motor or the like (not shown) along the guides 4A and 4B extending in the Y direction. The length of the guides 4A and 4B is set to be greater by at least the width of the measurement stage 5 than the movement stroke of the reticle stage RST during scanning exposure. The reticle stage RST comprises a combination of a coarse moving stage that moves in the Y direction and a fine moving stage with which the two-dimensional position on this coarse moving stage can be fine tuned. On the reticle stage RST is fixed a pair of reference mark plates 17C1 and 17C2 in a positional relationship that sandwiches the reticle R in the X direction, and two-dimensional plus-shaped (for example) reference marks MC1 and MC2 are formed in the reference mark plates 17C1 and 17C2, respectively. The positional relationship of the reference marks MC1 and MC2 to the original pattern of the reticle R is measured ahead of time with high precision and recorded in the memory component of the main control system 10.

A reference plate 6 composed of a slender (in the X direction) sheet of glass is fixed over the measurement stage 5, and a plurality of index marks IM for measuring the imaging characteristics of the projection optical system PL are formed on the reference plate 6. The reference plate 6 is big enough to cover the slit-shaped illumination region 9 of the exposure light on the reticle R, or more accurately, to cover the field of vision in the X direction on the reticle R side of the projection optical system PL. Use of the reference plate 6 eliminates the need to ready a dedicated reticle for measuring imaging characteristics and saves the time that would otherwise be spent replacing the dedicated reticle and the exposure light reticle R, so imaging characteristics can be measured at high precision and changes in the projection optical system PL over time can be accurately tracked. The measurement stage 5 is provided with a positioning mechanism used within a fine range in the X direction (the non-measurement direction). A pair of reference mark plates 17D1 and 17D2 is fixed on the measurement stage 5 so as to sandwich the reference plate 6 in the X direction, and two-dimensional plus-shaped (for example) reference marks MD1 and MD2 are formed in the reference mark plates 17D1 and 17D2, respectively. The positional relationship of the reference marks MD1 and MD2 to the plurality of index marks IM is also accurately measured ahead of time and recorded in the memory component of the main control system 10.

Thus, in this example, the measurement stage 5 for the reference plate 6 is provided independently from the reticle stage RST, and no other measurement member besides the reticle R is placed on the original reticle stage RST. Specifically, the reticle stage RST is only provided with scanning and positioning functions, which are the minimum requirement for scanning exposure, so the reticle stage RST is more compact and lightweight. Therefore, the reticle stage RST can be scanned at a higher speed, and this increases the throughput of the exposure step. Particularly in the case of reduced projection, the scanning speed of the reticle stage RST is $1/\beta$ times the scanning speed of the wafer stage (such as 4 or 5 times), so the upper limit to the scanning speed is more or less determined by the reticle stage, in which case the increase in throughput is particularly great.

Also, a laser beam is emitted from a laser interferometer 7Y disposed in the +Y direction with respect to the guides 4A and 4B and directed at a movable mirror 24Y on the side surface in the +Y direction of the reticle stage RST. A laser beam is emitted from biaxial laser interferometers 7X1 and 7X2 disposed in the +X direction and directed at a movable mirror 24X on the side surface in the +X direction of the reticle stage RST. The X coordinate, Y coordinate, and angle of rotation of the reticle stage RST are measured by the laser interferometers 7Y, 7X1, and 7X2, the measurement values are supplied to the main control system 10 in FIG. 1, and the main control system 10 controls the speed and position of the reticle stage RST via linear motors or the like on the basis of these measurement values. A laser beam is also emitted from a laser interferometer 8Y disposed in the −Y direction with respect to the guides 4A and 4B and directed at a movable mirror 25Y on the side surface in the −Y direction of the measurement stage 5, and the Y coordinate of the measurement stage 5 as measured by the laser interferometer 8Y is supplied to the main control system 10. The optical axes of the Y axis laser interferometers 7Y and 8Y each pass through the center of the illumination region 9 in the Y direction, that is, through the optical axis AX of the projection optical system PL, and the laser interferometers 7Y and 8Y measure the positions of the reticle stage RST and the measurement stage 5 in the scanning direction at all times.

The perpendicular side surfaces of the reticle stage RST may be mirror finished and these mirror surfaces may be considered to be the movable mirrors 24X and 24Y, and the perpendicular side surfaces of the measurement stage 5 may also be mirror finished and these mirror surfaces may be considered to be the movable mirrors 25X and 25Y.

In this example, as shown in FIG. 1, a pair of reticle alignment microscopes RA and RB may be disposed above the reticle R for detecting the amount of positional deviation of an alignment mark (reticle mark) formed on the reticle R from a reference mark (not shown) on the corresponding wafer stage. The straight line passing through the detection centers of the reticle alignment microscopes RA and RB is parallel to the X axis, and the center of these detection centers matches up with the optical axis AX. In this example, the reticle alignment microscopes RA and RB corresponding to the second measurement system of the present invention (absolute value measurement system) are used to detect the positions of the reference marks MC1 and MC2 on the reticle stage RST and the reference marks MD1 and MD2 on the measurement stage 5 as shown in FIG. 3.

If the reticle stage RST should be shunted in the +Y direction during measurement of imaging characteristics and the measurement stage 5 moved in the Y direction so that the reference plate 6 more or less covers the illumination region 9, then the laser beams from the laser interferometers 7X1 and 7X2 will diverge from the side surface of the reticle stage RST and illuminate the movable mirror 25X in the +x direction of the measurement stage 5. At this point the amounts of positional deviation from the detection centers (field center) of the reference marks MD1 and MD2 on the reference plate 6 are detected by the reticle alignment microscopes RA and RB, respectively, and the main control system 10 in FIG. 1 positions the measurement stage 5 so that the centers of the reference marks MD1 and MD2 will be symmetrical to the corresponding detection centers and the amount of positional deviation will be as small as possible. In this state, the measurement values of the X axis laser interferometers 7X1 and 7X2 are reset. These measurement values may also be preset to a specific value.

After this, the angle of rotation and position of the measurement stage 5 in the X direction are measured at high precision and with good reproducibility by the laser interferometers 7X1 and 7x2, and the position of the measurement stage 5 in the Y direction is constantly measured at high precision by the laser interferometer 8Y. Therefore, the main control system 10 can precisely control the position of the measurement stage 5 via linear motors or the like on the basis of these measurement values. Alternatively, instead of minimizing the amounts of positional deviation of the reference marks MD1 and MD2 as above, the measurement values of the laser interferometers 7X1 and 7X2 may be preset to corresponding values on the basis of these amounts of positional deviation.

Meanwhile, the position of the reticle stage RST in the non-scanning direction is not measured during the above measurement, but if the reticle stage RST comes under the illumination region 9 for exposure, then the movable mirror 24X of the reticle stage RST will once again be illuminated by the laser beams from the laser interferometers 7X1 and 7X2. Just as with the measurement stage 5, the reticle alignment microscopes RA and RB are used to detect the amounts of positional deviation of the reference marks MC1 and MC2 on the reticle stage RST from the detection centers of the reticle alignment microscopes RA and RB, and the main control system 10 presets the measurement values of the laser interferometers 7X1 and 7X2 to specific values when the reticle stage RST has been positioned so that these amounts of positional deviation are symmetrical and at a minimum. After this, the angle of rotation and position of the reticle stage RST in the X direction are measured with good reproducibility, and the position in the Y direction is constantly measured by the laser interferometer 7Y, so the reticle stage RST can be positioned at the desired position at high precision. Therefore, there is no interruption of the laser beams from the laser interferometers 7X1 and 7X2

Returning to FIG. 1, the wafer W is held on the wafer stage WST via a wafer holder (not shown), so that the wafer stage WST is able to move in the X and Y directions via an air bearing over a surface table 13. A focus leveling mechanism for controlling the angle of inclination and the position of the wafer W in the Z direction (the focal position) is also incorporated into the wafer stage WST. The measurement stage 14, which is equipped with various measurement devices, is placed on the surface table 13 such that it can move in the X and Y directions via an air bearing independently of the wafer stage WST. A mechanism for controlling the focal position is also incorporated into the measurement stage 14 on the upper surface thereof.

FIG. 2 is a plan view of the wafer stage WST and the measurement stage 14. In FIG. 2, a series of coils are embedded for example in a specific layout inside the surface table 13 on its top side, yokes and a series of magnets are embedded at the bottom of the wafer stage WST and the bottom of the measurement stage 14, and the coils and corresponding magnets make up planar motors. These planar motors independently control the angles of rotation and the positions of the wafer stage WST and the measurement stage 14 in the X and Y directions. Details of a planar motor are disclosed in Japanese Patent Application Laid-Open No. 8-51756, for instance.

The wafer stage WST in this example is furnished with the minimum functions required for exposure. Specifically, the wafer stage WST is equipped with a focus leveling function, and a wafer holder (on the bottom of the wafer W) for holding the wafer W by suction and a reference mark plate 17A on which a reference mark MA is formed for measuring the position of the wafer stage WST are provided on the wafer stage WST. A reference mark (not shown) for reticle alignment is also formed on the reference mark plate 17A.

As shown in FIG. 1, a wafer alignment sensor 16 of the type with which imaging is performed by off-axis method for the alignment of the wafer W is provided adjacent to the projection optical system PL. The detection signals of the wafer alignment sensor 16 are supplied to an alignment processing system in the main control system 10. The wafer alignment sensor 16 is used to measure the position of the alignment marks (wafer marks) provided to shot regions on the wafer W. In this example, the wafer alignment sensor 16 is used to detect the position of the reference marks MA on the wafer stage WST, for example. Specifically, the wafer alignment sensor 16 corresponds to the second measurement system (absolute value measurement system) of the present invention.

The surface of the measurement stage 14 is set at approximately the same height as the surface of the wafer W on the wafer stage WST. In FIG. 2, to the measurement stage 14 are fixed an illumination quantity monitor 18 comprising a photoelectric sensor for measuring the energy (incident energy) per unit of time for all of the exposure light that has passed through the projection optical system PL, a brightness unevenness sensor 19 comprising a photoelectric sensor for measuring the brightness distribution within the slit-shaped exposure region 12 produced by the projection optical system PL, a measurement board 20 on which are formed slits 21X and 21Y for measuring imaging characteristics, and a reference marker plate 17B on which is formed a reference mark MB that serves as a position reference. The positional relationship between the reference mark MB and the brightness unevenness sensor 19, etc., is previously measured at high precision and stored in the memory component of the main control system 10 in FIG. 1. The position of the reference mark MB is also measured by the wafer alignment sensor 16.

Condensing lenses and photoelectric sensors are disposed on the bottom surfaces of the X axis slit 21X and Y axis slit in the measurement board 20, and a spatial image detection system is constituted by the measurement board 20, the photoelectric sensors, and so forth. The edges of a rectangular aperture may be used in place of the slits 21X and 21Y. The light-receiving surface of the illumination quantity monitor 18 is formed large enough to cover the exposure region 12, the light-receiving portion of the brightness unevenness sensor 19 is in the form of a pinhole, and the detection signals of the illumination quantity monitor 18 and the brightness unevenness sensor 19 are supplied to the main control system 10 in FIG. 1.

The detection signal of the photoelectric sensor at the bottom of the measurement board 20 is supplied to the imaging characteristic computation system 11 shown in FIG. 1. In this case, during the measurement of the imaging characteristics of the projection optical system PL, the reference plate 6 on the measurement stage 5 on the reticle side in FIG. 3 is moved to the illumination region 9, the image of the index marks IM formed on the reference plate 6 is projected to the wafer stage side, and this image is scanned in the X and Y directions with the slits 21X and 21Y on the measurement board 20 while the detection signal from the photoelectric sensor on the bottom is taken in by the imaging characteristic computation system 11. The imaging characteristic computation system 11 processes this detection signal and detects the position, contrast, and so forth of the index marks IM, determines from this detection result the imaging characteristics such as the planar curvature of the projected image, distortion, and the best focal position, and outputs these to the main control system 10. Although not shown in the figures, there is also provided a mechanism for driving a specific lens in the projection optical system PL to correct a specific imaging characteristic such as distortion, and the main control system 10 is designed so that the imaging characteristics of the projection optical system PL can be corrected via this correction mechanism.

The sensors in FIG. 2, such as the photoelectric sensors at the bottom of the illumination quantity monitor 18, brightness unevenness sensor 19, and measurement board 20 provided to the measurement stage 14, are all connected to power sources, heat generating sources such as an amp, or communications signal cables. Therefore, if these sensors are mounted on the wafer stage WST used for exposure, there is the danger that the heat source attached to a sensor or tension on a signal cable may adversely affect the positioning precision. There is also the danger that the thermal energy produced by irradiation with the exposure light during measurement of imaging characteristics and so forth may lead to lower positioning precision. To deal with this, in this example, these sensors are provided to the measurement stage 14, which is separate from the wafer stage WST used for exposure, so the wafer stage WST can be more compact and lightweight, and this also prevents any decrease in positioning precision due to the thermal energy of exposure light during measurement or to a heat source of the sensors used for measurement. Furthermore, reducing the size of the wafer stage WST raises the wafer stage WST movement speed and controllability, improves the throughput of the exposure step, and enhances positioning precision and the like.

Also, a laser beam is emitted from a laser interferometer 15Y disposed in the +Y direction with respect to the surface table 13 and directed at a movable mirror 22Y on the side surface in the +Y direction of the wafer stage WST, a laser beam is emitted from biaxial laser interferometers 15X1 and 15X2 disposed in the −X direction and directed at a movable mirror 22X on the side surface in the −X direction of the wafer stage WST, the X coordinate, Y coordinate, and angle of rotation of the wafer stage WST are measured by the laser interferometers 15Y, 15X1, and 15X2. The measurement values are supplied to the main control system 10 in FIG. 1, and the main control system 10 controls the speed and position of the wafer stage WST via planar motors on the basis of these measurement values. Similarly, an X axis movable mirror 23X and a Y axis movable mirror 23Y are attached to the side surfaces of the measurement stage 14. The perpendicular side surfaces of the wafer stage WST may be mirror finished and these mirror surfaces considered to be the movable mirrors 22X and 22Y, and similarly the perpendicular side surfaces of the measurement stage 14 may also be mirror finished and these mirror surfaces considered to be the movable mirrors 23X and 23Y.

During measurement of the incident energy of the exposure light, for instance, the laser beams used for measuring these positions are directed at the movable mirrors 23X and 23Y of the measurement stage 14.

FIG. 4 illustrates an example of the layout of the wafer stage WST and the measurement stage 14 during measurement of the incident energy of the exposure light or the like.

If the wafer stage WST should be shunted to a positioned away from the exposure region 12 and the measurement stage 14 moved so as to come into the exposure region 12, the laser beams from the laser interferometers 15X1, 15X2, and 15Y will diverge from the movable mirrors 22X and 22Y of the wafer stage WST and be directed at the movable mirrors 23X and 23Y of the measurement stage 14. At this point the measurement stage 14 is moved so that the reference mark MB on the measurement stage 14 will enter the field 16a of the wafer alignment sensor 16 shown in FIG. 1, and the angle of rotation of the measurement stage 14 is adjusted so that the measurement values of the biaxial X axis laser interferometers 15X1 and 15X2 will be the same. In this state, the amount of positional deviation from the detection center (center of the field 16a) of the reference mark MB is detected. The main control system 10 presets the X and Y components of this amount of positional deviation to the measurement values of the laser interferometers 15X1, 15X2, and 15Y. After this, the position of the measurement stage 14 is measured at high precision and with good reproducibility by the laser interferometers 15X1, 15X2, and 15Y, and the main control system 10 controls the position of the measurement stage 14 at high precision via planar motors on the basis of these measurement values.

Meanwhile, during exposure, as shown in FIG. 2, the measurement stage 14 is shunted and the laser beams from the laser interferometers 15X1, 15X2, and 15Y are directed at the movable mirrors 22X and 22Y of the wafer stage WST, the reference mark MA is moved into the field 16a of the wafer alignment sensor 16, and amount of positional deviation from the detection center of the field 16a of the reference mark MA is measured in a state in which the measurement values of the laser interferometers 15X1 and 15X2 coincide. The measurement values of the laser interferometers 15X1, 15X2, and 15Y are preset on the basis of these measurement values of the positional deviation. After this, the wafer stage WST is positioned at high precision and with good reproducibility. Since the positions of the wafer stage WST and the measurement stage 14 can be roughly controlled by driving the planar motors with an open loop, the main control system 10 varies the positions of the wafer stage WST and the measurement stage 14 by driving the planar motors by open loop method.

Returning to FIG. 1, although not depicted, a grazing incidence type of focal position detection system (AF sensor) for measuring the focal position of the surface of the wafer W is disposed on the side surface of the projection optical system PL, and the surface of the wafer W being scanned and exposed is focused on the image plane of the projection optical system PL on the basis of this detection result.

Next, the operation of the projection exposure apparatus in this example will be described. First, the quantity of exposure light IL incident on the projection optical system PL is measured using the measurement stage 14 on the wafer stage side. In this case, in order to measure the quantity of incident light with the reticle R in a loaded state, in FIG. 1, a reticle R for exposure is loaded onto the reticle stage RST, and the reticle R moves into the illumination region of the exposure light IL. After this, as shown in FIG. 4, the wafer stage WST is shunted in the +Y direction, for example, on the surface table 13, and the measurement stage 14 moves toward the exposure region 12 of the projection optical system PL. After this, the presetting of the measurement values of the laser interferometers 15Y, 15X1, and 15X2 is carried out as above, the measurement stage 14 is then halted at the position where the light-receiving surface of the illumination quantity monitor 18 on the measurement stage 14 covers the exposure region 12, and in this state the quantity of exposure light IL is measured through the illumination quantity monitor 18.

The main control system 10 supplies this measured quantity of light to the imaging characteristic computation system 11. Here, the value obtained by detecting the light flux branching off from the exposure light IL in the illumination system 1, for instance, is also supplied to the imaging characteristic computation system 11, and the imaging characteristic computation system 11 calculates and stores a coefficient for indirectly computing the quantity of light incident on the projection optical system PL from the quantity of light monitored in the illumination system 1 on the basis of the two measurement values. During this interval, a wafer W is loaded on the wafer stage WST. After this, as shown in FIG. 2, the measurement stage 14 is shunted to a position away from the exposure region 12, while the wafer stage WST moves toward the exposure region 12. While the wafer stage WST is shunted, as shown in FIG. 4, it is not irradiated with the laser beams from the laser interferometers 15Y, 15X1, and 15X2, so positional control is performed, for example, by driving the planar motors by open loop method.

The measurement stage 14 is shunted away from the exposure region 12, the wafer stage WST is moved to a position in the exposure region 12, and the presetting of the measurement values of the laser interferometers 15Y, 15X1, and 15X2 is carried out as above, after which the wafer stage WST is moved so that the center of the reticle-use reference mark (not shown) for the reticle on the reference mark plate 17A on the wafer stage WST is located close to the optical axis AX (the center of the exposure region 12). After this, the reticle R is aligned using the reticle alignment microscopes RA and RB by driving the reticle stage RST in FIG. 1 so that positional deviation between the reticle mark on the reticle R and the corresponding reference mark on the reference mark plate 17A will be within a specific range of tolerance. Approximately simultaneously with this, the position of another reference mark MA is again detected by the wafer alignment sensor 16 shown in FIG. 1, the result of which is that the interval (baseline quantity) between the detection center of that sensor and the center of the projected image of the reticle R is correctly detected.

Next, the layout coordinates of the various shot regions of the wafer W are determined by detecting through the wafer alignment sensor 16 the position of the wafer mark provided to a specific shot region (sample shot) on the wafer W. After this, scanning exposure is performed while the shot region to be exposed of the wafer W is aligned with the pattern image of the reticle R on the basis of these layout coordinates and the above-mentioned baseline quantity. As shown in FIG. 1, during the scanning exposure of the various shot regions on the wafer W, the reticle R is scanned at a speed of VR in the +Y direction (or −Y direction) through the reticle stage RST with respect to the illumination region 9 of the exposure light IL (see FIG. 3), and in synchronization with this, the wafer W is scanned at a speed of $\beta \cdot VR$ ($\beta$ is the projection magnification) in the −Y direction (or +Y direction) through the wafer stage WST with respect to the exposure region 12.

During exposure, the quantity of light of the light flux branching off from the exposure light IL in the illumination system 1, for instance, is supplied to the imaging characteristic computation system 11, the imaging characteristic computation system 11 calculates the quantity of exposure light IL incident on the projection optical system PL on the basis of the supplied measurement value for quantity of light and a predetermined coefficient, calculates the amount of change in the imaging characteristics of the projection optical system PL (projection magnification, distortion, etc.) due to the absorption of the exposure light IL, and supplies this calculation result to the main control system 10. The main control system 10 corrects the imaging characteristics by driving a specific lens in the projection optical system PL, for instance.

The above description is of ordinary exposure, but when the status of the device is determined for the maintenance of the projection exposure apparatus in this example, for instance, the measurement stage 14 is moved to the exposure region 12 side for this measurement. For example, when the uniformity of brightness in the exposure region 12 is measured, the reticle R is removed from the reticle stage RST, after which the brightness distribution is measured while the brightness unevenness sensor 19 is moved in the X and Y directions within the exposure region 12, as shown in FIG. 4.

Next, the operation of using the measurement stage 5 on the reticle stage side and the measurement stage 14 on the wafer stage side to measure the imaging characteristics of the projection optical system PL will be described. In this case, as shown in FIG. 3, the reticle stage RST is shunted in the +Y direction, and the reference plate 6 on the measurement stage 5 is moved into the illumination region 9. At this point the laser beams of the laser interferometers 7X1 and 7X2 in the non-scanning direction are directed at the measurement stage 5, and the resetting (or presetting) of the measurement values is performed as above using the reticle alignment microscopes RA and RB. After this, the measurement stage 5 is positioned at high precision on the basis of the measurement values of the laser interferometers 7X1, 7X2, and 8Y.

Here, as already described, the images of the plurality of index marks IM are projected on the wafer stage side via the projection optical system PL. In this state, as shown in FIG. 4, the measurement stage 14 is driven and the images of these index marks IM are scanned in the X and Y directions with the slits on the measurement board 20, and the detection signals from the photoelectric sensors on the bottom of the measurement board 20 are processed by the imaging characteristic computation system 11, by which the position and contrast of these images are determined. The position and contrast of these images are also determined while the focal position of the measurement board 20 is varied a certain amount at a time. From these measurement results the imaging characteristic computation system 11 determines the amount of fluctuation in imaging characteristics, namely, the best focal position of the projected image of the projection optical system PL, the image plane curvature, and distortion (including magnification error). If this fluctuation exceeds a tolerable range, the main control system 10 corrects the imaging characteristics of the projection optical system PL.

As discussed above, with the projection exposure apparatus in this example, the positions of the reference marks MA and MB are detected by the wafer alignment sensor 16, and the laser interferometers 15X1, 15X2, and 15Y are preset on the basis of this position information, so the position of the wafer stage WST or the measurement stage 14 can be measured at high precision and with good reproducibility by the laser interferometers 15X1, 15X2, and 15Y. Similarly, the position of the reticle stage RST or the measurement stage 5 can be measured at high precision and with good reproducibility by detecting the positions of the reference marks MC1 and MC2 or MD1 and MD2 using the reticle alignment microscopes RA and RB, and resetting the laser interferometers 7X1 and 7X2, for instance.

The second embodiment of the present invention will now be described through reference to FIGS. 5 to 12. This is an example of applying the present invention to a step-and-scan type of projection exposure apparatus in which exposure is performed by the double exposure method.

Figure 5:
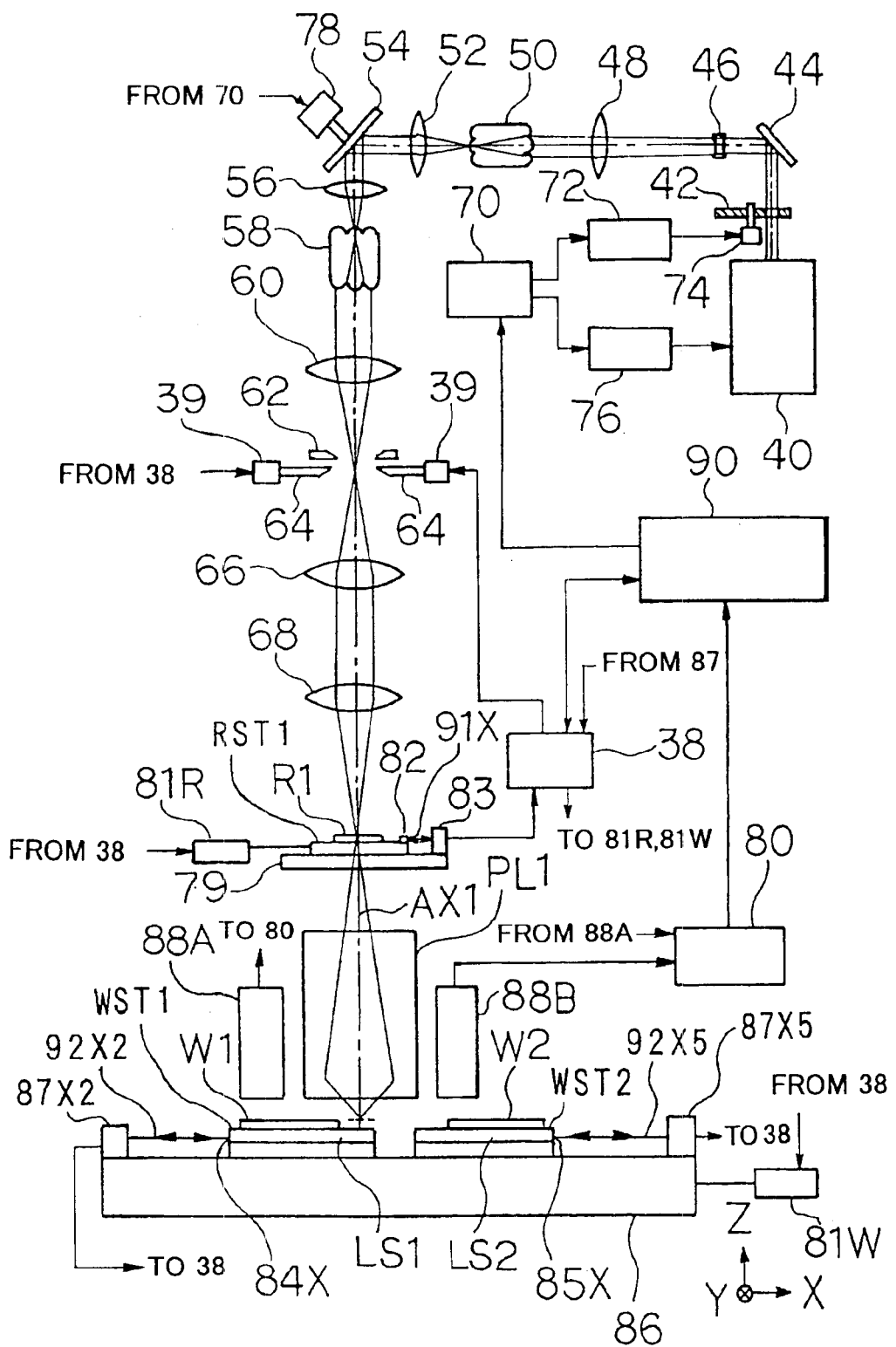
FIG. 5 is a simplified structural diagram of a projection optical system in the second embodiment of the present invention.

FIG. 5 shows the simplified structure of the projection exposure apparatus in this example. In FIG. 5, the projection exposure apparatus of this example comprises a stage device equipped with wafer stages WST1 and WST2 as a plurality of movable stages for supporting and independently moving two-dimensionally wafers W1 and W2 as sensitive substrates on a base plate 86; a projection optical system PL1 disposed above this stage device; a reticle drive mechanism for driving in a specific scanning direction a reticle R1 or R2 (see FIG. 6) as a mask above the projection optical system PL1; an illumination system for illuminating the reticles R1 and R2 from above; and a control system for controlling these various components. In the following discussion, the Z axis extends parallel to the optical axis AX1 of the projection optical system PLI, the X axis is parallel to the viewing plane in FIG. 5 within a plane perpendicular to the Z axis, and the Y axis is perpendicular to the viewing plane in FIG. 5. In this example, the scanning direction is the direction parallel to the Y axis (the Y direction).

First, the stage device is supported floating on an air bearing (not shown) over the base plate 86, and is equipped with two wafer stages WST1 and WST2 capable of independent movement in the X and Y directions, a wafer stage drive system 81W for driving these wafer stages WST1 and WST2, and an interferometer system for measuring the positions of the wafer stages WST1 and WST2.

This configuration will now be described in further detail. A plurality of air pads (such as vacuum pre-loaded air bearings; not shown) are provided on the bottoms of the wafer stages WST1 and WST2, and the wafer stages WST1 and WST2 are supported floating above the base plate 86 in a state in which a gap of a few microns, for example, is maintained through the balance between the vacuum pre-pressure and the air discharge force of these air pads.

Figure 7:
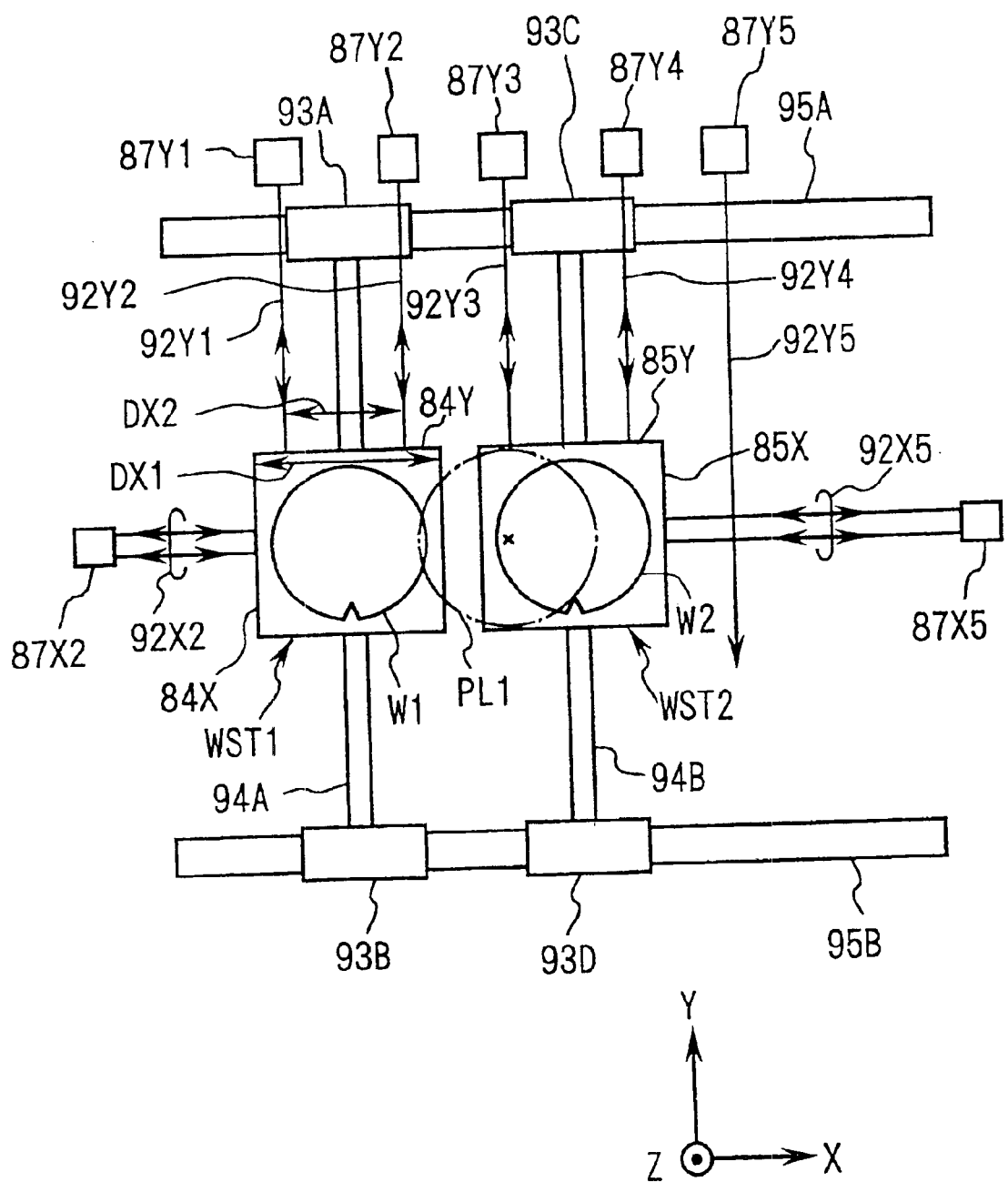
FIG. 7 is a plan view of the structure of the drive mechanism of the wafer stage in FIG. 5.

FIG. 7 shows the drive mechanism of the wafer stages WST1 and WST2. In FIG. 7, two X axis linear guides 95A and 95B extending in the X direction are provided in parallel on the base plate 86. A set of permanent magnets for a linear motor is fixed along each of the X axis linear guides 95A and 95B, and two movable members 93A and 93C and two movable members 93B and 93D are provided movably along these X axis linear guides 95A and 95B, respectively. To the bottom of each of these four movable members 93A to 93D is attached a drive coil (not shown) so as to surround the X axis linear guides 95A and 95B from the sides and from above. These drive coils and the X axis linear guides 95A and 95B make up moving coil linear motors that drive the movable members 93A to 93D in the X direction. For the sake of convenience in the following description, these movable members 93A to 93D will be referred to as "X axis linear motors."

Of these, the two X axis linear motors 93A and 93B are provided to the ends of a Y axis linear guide 94A extending in the Y direction, and the other two X axis linear motors 93C and 93D are fixed to the ends of a Y axis linear guide 94B also extending in the Y direction. A set of drive coils for a linear motor is fixed in the Y direction along each of the Y axis linear guides 94A and 94B. Therefore, the Y axis linear guide 94A is driven in the X direction along the X axis linear guides 95A and 95B by the X axis linear motors 93A and 93B, and the Y axis linear guide 94B is driven in the Y direction along the X axis linear guides 95A and 95B by the X axis linear motors 93C and 93D.

Meanwhile, a set of permanent magnets (not shown) is provided to the bottom of the wafer stage WST1 so as to surround one of the Y axis linear guides 94A from the sides and above, and these permanent magnets and the Y axis linear guide 94A make up a moving magnet linear motor that drives the wafer stage WST1 in the Y direction. Similarly, a moving magnet linear motor that drives the wafer stage WST2 in the Y direction is made up of a set of permanent magnets (not shown) provided to the bottom of the wafer stage WST2 and the Y axis linear guide 94B.

Specifically, in this example a stage system for two-dimensionally and independently driving the wafer stages WST1 and WST2 over the XY plane is constituted of the above-mentioned X axis linear guides 95A and 95B, the X axis linear motors 93A to 93D, the Y axis linear guides 94A and 94B, the permanent magnets (not shown) on the bottoms of the wafer stages WST1 and WST2, and so forth. These wafer stages WST1 and WST2 are controlled by a stage controller 38 via the stage drive system 81W. The operation of the stage controller 38 is controlled by a main controller 90.

It is also possible to generate or eliminate a subtle yawing in the wafer stage WST1 by slightly varying the balance of propulsion of the pair of X axis linear motors 93A and 93B provided to the ends of the Y axis linear guide 94A. Similarly, a subtle yawing can be generated or eliminated in the wafer stage WST2 by slightly varying the balance of propulsion of the pair of X axis linear motors 93C and 93D. Wafers W1 and W2 are fixed by vacuum chucking or the like on these wafer stages WST1 and WST2 via wafer holders (not shown). The wafer holders are finely driven in the Z direction and the θ direction (the direction of rotation around the Z axis) by a Z/θ drive mechanism (not shown).

Figure 6:
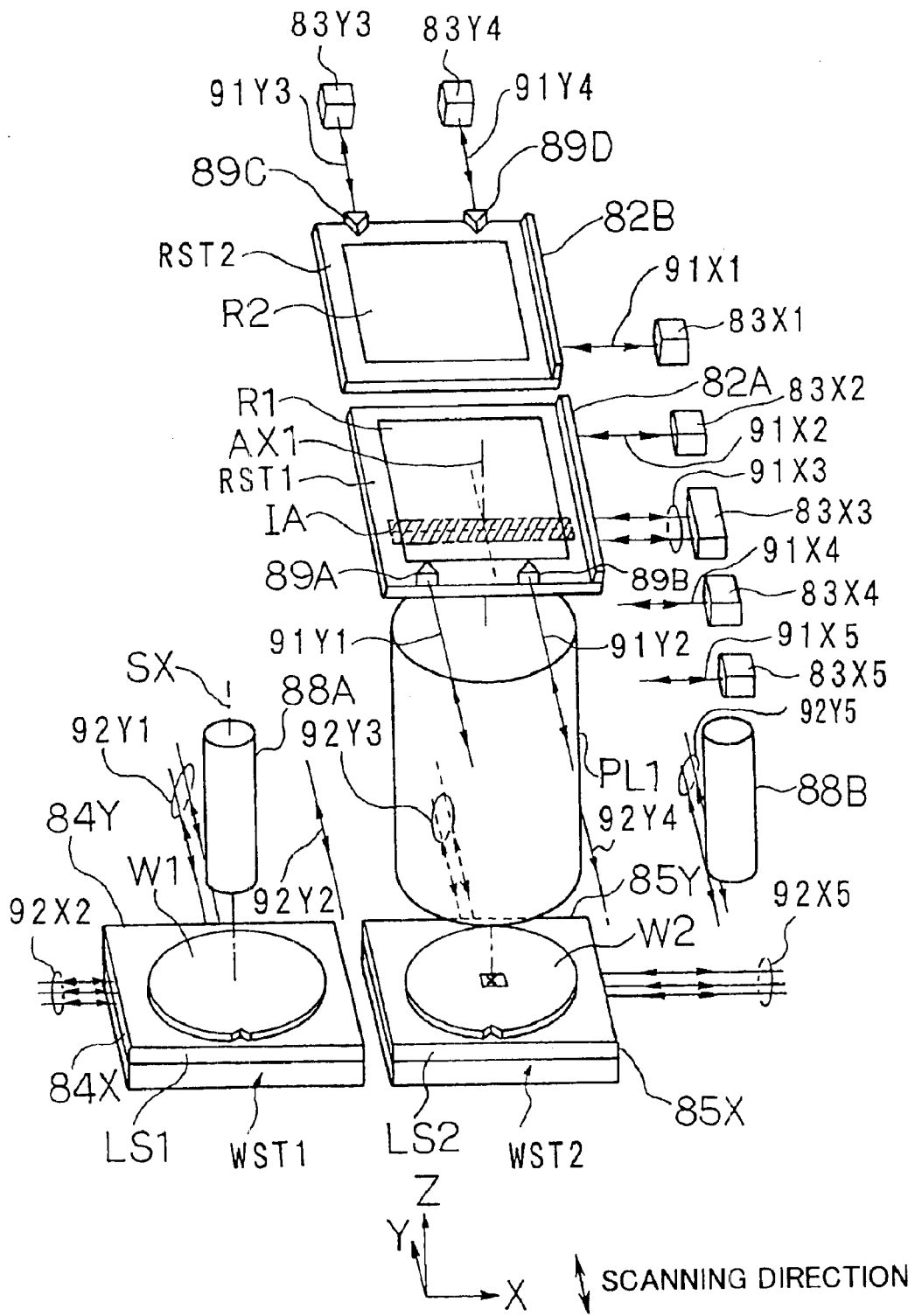
FIG. 6 is an oblique view of the positional relationship between the two wafer stages WST1 and WST2, the two reticle stages RST1 and RST2, the projection optical system PL1, and the alignment systems 88A and 88B in the embodiment of FIG. 5.

The side surfaces of the wafer stage WST1 in the −X and +Y directions are mirror finished to produce reflective surfaces 84X and 84Y (see FIG. 6). Similarly, the side surfaces of the wafer stage WST2 in the +X and −Y directions are mirror finished to produce reflective surfaces 85X and 85Y. These reflective surfaces correspond to movable mirrors, and by projecting measurement beams 92X2, 92X5, and 92Y1 to 92Y5 consisting of laser beams from the various laser interferometers that make up the interferometer system (discussed below) onto these reflective surfaces and receiving the reflected light with the various laser interferometers, the displacement of the various reflective surfaces from a reference surface (a reference mirror is generally disposed on the projection optical system side surface or on the alignment optical system side surface, and this mirror is used as a reference surface) is measured, the result of which is that the two-dimensional positions of the wafer stages WST1 and WST2 are measured. The structure of the interferometer system will be described in detail below.

In FIG. 5, a refraction optical system that comprises a plurality of lens elements sharing an optical axis in the Z direction, and that is telecentric on the sides and has a specific reduction factor, such as ⅕, is used as the projection optical system PL1. A reflection refraction system or a reflection system may also be used as the projection optical system PL1.

As shown in FIG. 5, off-axis alignment systems 88A and 88B both having the same functions are provided to the X direction ends of the projection optical system PL1 at positions an equal distance away from the optical axis AX1 of the projection optical system PL1 (corresponds to the center of the projected image of the reticle pattern). These alignment systems 88A and 88B have three types of alignment sensor: an LSA (Laser Step Alignment) system with a slit-shaped laser beam, an imaging type of FIA (Field Image Alignment) system, and an LIA (Laser Interferometric Alignment) system that detects diffracted light from two heterodyne beams, for example. These alignment systems 88A and 88B allow positional measurement in two dimensions (the X and Y directions) for the reference mark on the reference mark plate and the alignment mark on a wafer. In this example, these three types of alignment sensor are used as dictated by the situation at hand, and perform so-called search alignment in which the positions of three one-dimensional marks on a wafer are detected to measure the approximate position of the wafer, fine alignment in which the positions of the various shot regions on a wafer are accurately measured, and so on.

In this case, one of the alignment systems 88A is used, for instance, to measure the position of the alignment mark on the wafer W1 supported on the wafer stage WST1. The other alignment system 88B is used, for instance, to measure the position of the alignment mark on the wafer W2 supported on the wafer stage WST2. The detection signals from the alignment sensors that constitutes these alignment systems 88A and 88B are sent to an alignment controller 80. The alignment controller 80 subjects the detection signals A/D (analog/digital) conversion, and subjects the digitized waveform signals to computation processing to detect the mark position. This detection result is sent to a main controller 90, and information such as position correction during exposure is outputted from the main controller 90 to the stage controller 38 according to this detection result.

Although not depicted in the figures, the projection optical system PL1 and the alignment systems 88A and 88B are each provided with an autofocus/autoleveling measurement mechanism (hereinafter referred to as the "AF/AL system") for detecting the amount of defocus from the best focal position of the exposure side of the wafer W1 (or W2) of these, a so-called grazing incidence type of multipoint AF system is used as the AF/AL system for the projection optical system PL1. The same AF/AL system is provided to the alignment systems 88A and 88B as well. Specifically, in this example the detection beam can be directed by the AF/AL system used during the alignment sequence for approximately the same measurement region as the AF/AL system used in the detection of the amount of defocus during exposure. Accordingly, the position of the alignment mark can be measured at high precision and at the same focusing precision as during exposure during the alignment sequence in which the alignment systems 88A and 88B are used as well. Put another way, no offset (error) is produced by the attitude of the stage between exposure and alignment.

Next, the reticle drive mechanism will be described through reference to FIGS. 5 and 6. This reticle drive mechanism comprises a reticle stage RST1 capable of two-dimensional movement in the XY plane and supporting a reticle R1 over a reticle base table 79; a reticle stage RST2 capable of two-dimensional movement and supporting a reticle R2 in the same movement plane; a linear motor (not shown) for driving these reticle stages RST1 and RST2; and a reticle interferometer system that manages the positions of these reticle stages RST1 and RST2.

To describe this in further detail, as shown in FIG. 6, these reticle stages RST1 and RST2 are disposed in series in the scanning direction (Y direction), are supported floating over the reticle base table 79 by air bearings (not shown), and are finely driven in the X direction, finely rotated in the θ direction, and scan-driven in the Y direction by a reticle stage drive mechanism 81R (see FIG. 5). The drive source of the reticle stage drive mechanism 81R is the same linear motor as for the stage device for wafer, but is depicted as a simple block in FIG. 5 for the sake of simplicity. Accordingly, when the reticles R1 and R2 on the reticle stages RST1 and RST2 are used selectively in double exposure, for instance, either of the reticles R1 and R2 can be scanned synchronously with the wafers W1 and W2.

Movable mirrors 82A and 82B composed of the same material as the reticle stages RST1 and RST2 (such as a ceramic) extend in the Y direction from the +X direction side surfaces on these reticle stages RST1 and RST2. Measurement beams 91X1 and 91X2 are emitted from laser interferometers (hereinafter referred to simply as "interferometers") 83X1 to 83X5 and directed at the +X direction reflective surfaces of these movable mirrors 82A and 82B, this reflected light is received by the interferometers 83X1 to 83X5, and the relative displacement with respect to a specific reference surface is measured, the result of which is that the positions of the reticle stages RST1 and RST2 in the X direction are measured. Here, the measurement beam 91X3 from the interferometer 83X3 actually has two measurement beams separated in the Y direction and capable of independently measuring displacement. The positions of the reticle stages RST1 and RST2 in the X direction and the amount of yaw (the angle of rotation around the Z axis) can be measured from these two measurement values.

In this example, the spacing between the measurement beams 91X1 to 91X5 in the Y direction is set shorter than the width of the movable mirrors 82A and 82B in the Y direction, which results in the movable mirrors 82A and 82B being irradiated by one of the measurement beams 91X1 to 91X5 at all times. At some point in time, two adjacent measurement beams (such as 91X1 and 91X2) will end up being directed at the same movable mirror (such as 82B) at the same time, and this state can be viewed as the corresponding interferometers 83X1 and 83X2 partially overlapping the measurement region. As a result, as will be discussed below, the measurement values of the interferometers 83X1 to 83X4 can be successively transferred at high precision to the measurement values of the interferometers 83X2 to 83X5. The measurement values of the interferometers 83X1 to 83X5 are supplied to the stage controller 38 in FIG. 5, and the stage controller 38 performs rotational control and X direction positional control of the reticle stages RST1 and RST2 via the reticle stage drive mechanism 81R on the basis of these measurement values in order to correct the synchronization error between the wafer stages WST1 and WST2.

Meanwhile, in FIG. 6, corner cubes 89A and 89B are disposed as a pair of movable mirrors at the −Y direction end of the first reticle stage RST1 in the scanning direction. Measurement beams 91Y1 and 91Y2 consisting of two laser beams are emitted from a pair of double-pass interferometers (not shown) and directed at these corner cubes 89A and 89B, and the relative displacement in the Y direction of the reticle stage RST1 with respect to a specific reference surface is measured by this pair of interferometers not shown in the figures. A pair of corner cubes 89C and 89D is also disposed the +Y direction end of the second reticle stage RST2, measurement beams 91Y3 and 91Y4 (actually consisting of two laser beams each) are emitted from a pair of double-pass interferometers 83Y3 and 83Y4 and directed at these corner cubes 89C and 89D, and the displacement in the Y direction of the reticle stage RST2 is measured by the interferometers 83Y3 and 83Y4.

The measurement values from these double-pass interferometers are also supplied to the stage controller 38 in FIG. 5, and the positions of the reticle stages RST1 and RST2 in the Y direction are controlled on the basis of these measurement values. Specifically, in this example, the interferometers system used for the reticle system is constituted of the interferometers 83X1 to 83X5 having measurement beams 91X1 to 91X5, and the two pairs of double-pass interferometers having measurement beams 91Y1 and 91Y2 and measurement beams 91Y3 and 91Y4. The interferometers 83X1 to 83X5 are represented by the interferometer 83 in FIG. 5, and the movable mirrors 82A and 82B and the measurement beams 91X1 to 91X5 are expressed by the movable mirror 82 and the measurement beam 91X in FIG. 5.

Next the interferometer system that manages the positions of the wafer stages WST1 and WST2 will be described through reference to FIGS. 5 to 7.

As shown in FIGS. 5 to 7, a measurement beam 92X2 consisting of triaxial laser beams from the interferometer 87X2 is directed at the reflective surface 84X on the side surface in the −X direction of the wafer stage WST1 along an axis parallel to the X axis, passing through the center (optical axis AX1) of the projected image of the projection optical system PL1 and the detection centers of the alignment systems 88A and 88B. Similarly, a measurement beam 92X5 consisting of triaxial laser beams from the interferometer 87X5 is directed at the reflective surface 85X on the side surface in the +X direction of the wafer stage WST2. The reflect light here is received by the interferometers 87X2 and 87X5, the result of which is that the relative displacement of the reflective surfaces in the X direction from the reference position is measured.

In this case, as shown in FIG. 6, the measurement beams 92X2 and 92X5 are triaxial laser beams capable of measuring displacement independently of one another, so the corresponding interferometers 87X2 and 87X5 not only measure the positions of the wafer stages WST1 and WST2 in the X direction, they also can measure the tilt angle (the angle of rotation around the Y axis) and the angle of yaw (the angle of rotation around the Z axis) of the stages. In this case, the wafer stages WST1 and WST2 in this example are provided with Z leveling stages LS1 and LS2 for respectively performing the fine drive of the wafer stages WST1 and WST2 in the Z direction, the drive of the tilt angle, and the rotational drive around the Z axis, as shown in FIG. 6, but the Z leveling stages LS1 and LS2 are actually lower than the reflective surfaces 84X and 85X. Therefore, the drive amounts in the tilt angle control and yaw angle control of the wafers W1 and W2 can all be monitored by these interferometers 87X2 and 87X5.

The X axis measurement beams 92X2 and 92X5 are directed at the reflective surfaces 84X and 85X of the wafer stages WST1 and WST2 at all times in the whole region of the movable range of the wafer stages WST1 and WST2. Therefore, in the X direction, whether during exposure using the projection optical system PL1 or during the use of the alignment systems 88A and 88B, the positions of the wafer stages WST1 and WST2 in the X direction are managed on the basis of the measurement values obtained with the measurement beams 92X2 and 92X5.

As shown in FIGS. 6 and 7, the +Y direction side surfaces of the wafer stages WST1 and WST2 are finished to produce the reflective surfaces 84Y and 85Y as movable mirrors, and a measurement beam 92Y3 parallel to the Y axis and passing through the optical axis AX1 of the projection optical system PL1 is emitted from the interferometer 87Y3 and directed at these reflective surfaces 84Y and 85Y. Interferometers 87Y1 and 87Y5 having measurement beams 92Y1 and 92Y5, respectively, are provided parallel to the Y axis and passing through the detection centers of the alignment systems 88A and 88B, respectively. In this example, the measurement value of the interferometer 87Y3 having the measurement beam 92Y3 is used to measure the positions of the wafer stages WST1 and WST2 during exposure using the projection optical system PL1, and the measurement value of the interferometer 87Y1 or 87Y5 is used to measure the position in the Y direction of the wafer stage WST1 or WST2 during the use of the alignment systems 88A and 88B.

Therefore, depending on the usage conditions, the measurement beams of the Y axis interferometers 87Y1, 87Y3, and 87Y5 may diverge from the reflective surfaces 84Y and 85Y of the wafer stages WST1 and WST2. Consequently, in this example, the interferometer 87Y2 having the measurement beam 92Y2 parallel to the Y axis is provided between the interferometers 87X1 and 87Y3, and the interferometer 87Y4 having the measurement beam 92Y4 parallel to the Y axis is provided between the interferometers 87Y3 and 87Y5, the result of which is that the reflective surfaces 84Y and 85Y of the wafer stages WST1 and WST2 are irradiated at all times by a measurement beam from at least one of the interferometers. Accordingly, if we let DX1 be the width in the X direction of the reflective surfaces 84Y and 85Y serving as movable mirrors, then the spacing DX2 between the measurement beams 92Y1, 92Y2, . . . , and 92Y5 in the X direction is set narrower than DX1. As a result, two adjacent measurement beams out of the measurement beams 92Y1 to 92Y5 will always be directed at the reflective surfaces 84Y and 85Y at the same time (that is, there is a partially overlapping measurement range), so the transfer of measurement values from the first interferometer to the second interferometer will always happen in this state, as will be discussed below. This means that the wafer stages WST1 and WST2 are positioned at high precision and with good reproducibility in the Y direction as well.

The measurement beams 92Y1, 92Y3, and 92Y5 used to measure positions in the Y direction consist of biaxial laser beams spaced apart in the Z direction and capable of independent position measurement, so the corresponding interferometers 87Y1, 87Y3, and 87Y5 not only measure the positions of the reflective surfaces 84Y and 85Y in the Y direction, they also can measure the tilt angle around the X axis. In this example, the interferometer system for managing the two-dimensional coordinate positions of the wafer stages WST1 and WST2 is made up of a total of seven interferometers, namely, the interferometers 87X2, 87X5, and 87Y1 to 87Y5. In this example, as will be discussed below, while one of the wafer stages WST1 and WST2 is executing the exposure sequence, the other executes wafer exchange and the alignment sequence, and the stage controller 38 performs position and speed control of the wafer stages WST1 and WST2s on the basis of the measurement values of the various interferometers so that there will not physically interfere with each other.

Next, the illumination system and control system in this example will be described through reference to FIG. 5. In FIG. 5, the exposure light, which is composed of pulsed laser light emitted from a light source component 40 comprising a KrF, ArF, $F_2$, or other such excimer laser light source and a light reduction system (such as a light reducing plate), is passed through a shutter 42, after which it is polarized by a mirror 44, shaped to a suitable beam diameter by beam expanders 46 and 48, and incident on a first fly-eye lens 50. The exposure light emitted from this first fly-eye lens 50 goes through a lens 52, an oscillation mirror 54, and a lens 56, and is incident on a second fly-eye lens 58. The exposure light emitted from the second fly-eye lens 58 goes through a lens 60 and reaches a stationary blind 62 disposed at a position that is conjugate with the reticle R1 (or R2), where the cross sectional shape thereof is set to the specified shape, after which it is passed through a movable blind 64 disposed at a position slightly defocused from the conjugate plane with the reticle, and then passes through relay lenses 66 and 68 to produce light with a uniform brightness distribution. This light illuminates an illumination region IA in a specific shape on the reticle R1, which is a rectangular slit-shape here (see FIG. 6).

Next, the control system in this example is constituted primarily of the main controller 90 for the general control of the apparatus as a whole, and of an exposure light quantity controller 70, the stage controller 38, and so forth under the management of this main controller 90. For example, when the wafer W1 is exposed in the pattern of the reticle R1, the exposure light quantity controller 70 opens the shutter 42 by sending a command to a shutter driver 72 to drive a shutter drive component 74 prior to the start of synchronous scanning of the reticle R1 and wafer W1.

After this, the stage controller 38 starts the synchronous scanning of the reticle R1 and wafer W1, that is, the reticle stage RST1 and the wafer stage WST1, according to instructions from the main controller 90. This synchronous scanning is performed by monitoring the measurement values of the measurement beams 91Y1, 91Y2, and 91X3 of the interferometer system used for the reticle stage and the measurement beams 92Y3 and 92X2 of the interferometer system used for the wafer stage as discussed above, while controlling the stage drive system 81W and the reticle stage drive mechanism 81R with the stage controller 38.

The exposure light quantity controller 70 commences pulsed light generation by sending a command to a laser controller 76 at the point when the stages RST1 and WST1 are driven at the same speed, using the projection magnification ratio as the speed ratio, within a specific synchronization error range. As a result, the rectangular illumination region IA (see FIG. 6) of the reticle R1 is illuminated by the exposure light, the image of the pattern in this illumination region IA is reduced by the projection optical system PL1 to ⅕ its original size, and this is projected to expose a wafer W1 whose surface has been coated with a photoresist. Here, as is clear from FIG. 6, the width of the illumination region IA in the scanning direction is narrower than the pattern region on the reticle R1, and when the reticle R1 and the wafer W1 are synchronously scanned, the images from the entire pattern region are successively transferred to the shot region on the wafer. In this exposure, the exposure light quantity controller 70 reduces brightness unevenness caused by fringes generated by the two first fly-eye lenses 50 and 58 by sending a command to a mirror driver 78 to drive the oscillation mirror 54.

The movable blind 64 is driven by a blind controller 39 synchronously with the reticle R1 and the wafer W1, and this series of synchronous operations is managed by the stage controller 38 so that the exposure light that has passed through the outer part of the pattern region on the reticle R1 (the outer part of the doused band) will not leak close to the edges of the various shot regions on the wafer W1 during scanning exposure. Furthermore, when the main controller 90 corrects the approach start position for the reticle stage and wafer stage at which synchronous scanning is performed during scanning exposure, for instance, it sends a correction command for the stage position to the stage controller 38 that controls the movement of the stages.

Next, a plurality of interferometers with partially overlapping measurement ranges are disposed at the reticle stages RST1 and RST2 and the wafer stages WST1 and WST2 in this example as mentioned above, and the measurement value of the interferometer are successively transferred to the adjacent interferometer thereto. The following is an example of the wafer stage WST2 and the two Y axis interferometers 87Y3 and 87Y4 in FIG. 7, and the operation of transferring the interferometer measurement values, that is, the operation of presetting the interferometer measurement values, is described through reference to FIGS. 7 to 10.

First, when the wafer stage WST2 moves in the −X direction from its position in FIG. 7, the measurement beam 92Y4 ceases to be incident on the reflective surface 85Y (serving as the movable mirror of the wafer stage WST2) at some point during this movement. Conversely, when the wafer stage WST2 moves in the +X direction, the measurement beam 92Y3 ceases to be incident on the reflective surface 85Y at some point during this movement. In view of this, the transfer of measurement values must be performed at high precision between the interferometer 87Y4 and the interferometer 87Y3, and the measurement of the Y coordinate of the wafer stage WST2 must be performed with good reproducibility using one of these interferometers 87Y4 and 87Y3. Consequently, the following approach is employed in this example.

Figure 8:
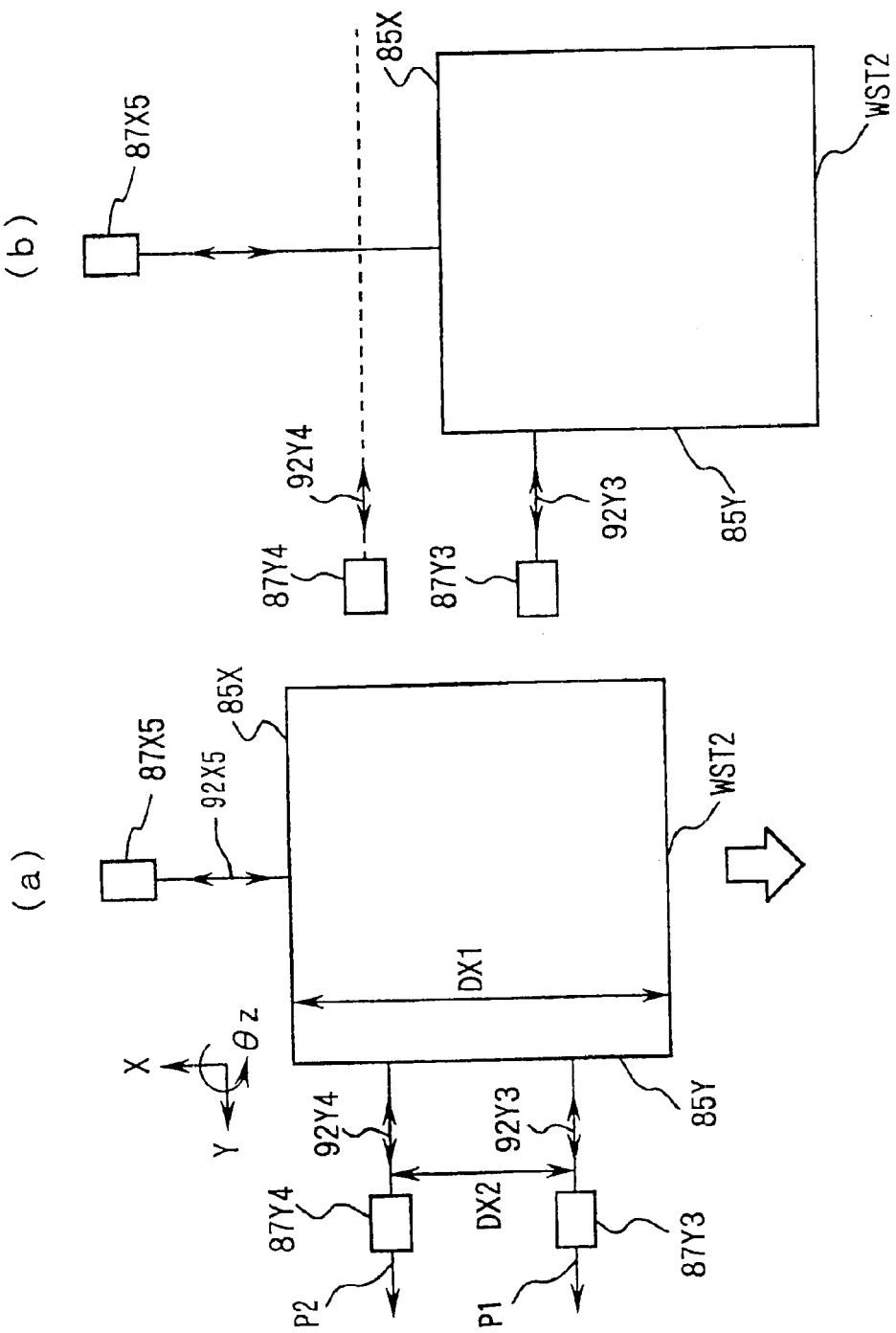
FIGS. 8(a) and (b) are diagrams illustrating the measurement value setting of an interferometer as performed in the second embodiment of the present invention.

FIG. 8(*a*) is a plan view of the wafer stage WST2 in FIG. 7. In FIG. 8(*a*), the displacement of the wafer stage WST2 in the X direction is measured by the X direction interferometer 87X5, while the displacement of the wafer stage WST2 in the Y direction is measured by the two interferometers 87Y3 and 87Y4. The spacing DX2 in the X direction of the measurement beams 92Y3 and 92Y4 of the interferometers 87Y3 and 87Y4 is narrower than the width DX1 in the X direction of the reflective surface 85Y of the wafer stage WST2.

Here, the interferometers 87Y4 and 87Y3 in this example are heterodyne interference type laser interferometers, and a common two-frequency oscillating laser (such as a Zeeman effect type of He—Ne laser light source with a wavelength of 633 nm) is used as the light source for the measurement beams. This two-frequency oscillating laser emits first and second light fluxes having a specific frequency differential of Δf (such as about 2 MHz) and whose polarization directions are mutually perpendicular as a coaxial heterodyne beam. First, this heterodyne beam is divided up into parts of about ¹⁄₁₀ and mixed by an analyzer, and the resulting interference light is subjected to photoelectric conversion, which produces a reference signal SR of the frequency Δf. This reference signal SR is supplied to a phase comparator 26 (see FIG. 9) in each of the interferometers 87Y4 and 87Y3.

The first and second heterodyne beams obtained by splitting the above-mentioned heterodyne beam into parts of about ¹⁄₁₀ are supplied to the interferometers 87Y3 and 87Y4. The interferometer 87Y4 uses one of the two light fluxes, namely, the one whose polarization direction is perpendicular to the second heterodyne beam, as the measurement beam 92Y4, and uses the other one as a reference beam (not shown). The reference beam is reflected by a reference mirror (not shown). The reflected reference beam and the measurement beam 92Y4 reflected by the reflective surface 85Y are mixed by an analyzer, and the resulting interference light is subjected to photoelectric conversion, which produces a measurement signal S2 that has a frequency of Δf and whose phase varies. This signal is supplied to the phase comparator 26 in FIG. 9. The phase difference φ2 between the above-mentioned reference signal SR and the measurement signal S2 is found at a specific resolution (such as 2π/100 (rad), or 2π/256 (rad)) and supplied to an integrator 27.

Here, if we let λ be the wavelength of the measurement beams 92Y3 and 92Y4 and m be an integer ($1 \leq m$), the phase difference φ2 changes by 2π (rad) when the reflective surface 85Y moves in the Y direction by λ/m (m=2 with a single pass method as in this example, but m=4 with a double pass method). The range of the phase difference φ2 is $0 \leq 2 \leq 2\pi$. The integrator 27 in FIG. 9 adds 1 to a specific integer N2 (corresponding to the degree of interference) when the phase difference φ2 crosses 2π in the positive direction, and subtracts 1 from this integer N2 when the phase difference φ2 crosses 0 in the negative direction. During measurement, the integrator 27 multiplies λ/m by {N1+φ2/(2π)}, and sends the resulting measurement value P2 to the stage controller 38 as the absolute position of the wafer stage WST2 in the Y direction.

Similarly, with the interferometer 87Y3, the phase difference φ1 is found between the measurement signal S1 obtained from the measurement beam 92Y3 and the above-mentioned reference signal SR, and an integer N1 that increases or decreases every time this phase difference φ1 crosses 2π or 0 and a measurement value P1 calculated from λ/m are sent to the stage controller 38. Specifically, the interferometers 87Y3 and 87Y4 measure the position of the wafer stage WST2 in the Y direction as an absolute position within the width of λ/m. The interferometer 87X5 of the X axis in this example comprises two laser beams separated in the Y direction as shown in FIG. 6, so the angle of rotation θW2 of the wafer stage WST2 can be measured from the difference in the measurement values for the X coordinate of the reflective surface 85X produced by these two laser beams. In view of this, the integers N2 and N1 in the interferometers 87Y4 and 87Y3 are first reset to zero in the "initial state" in which the wafer stage WST2 has been stopped so that the angle of rotation θW2 will be zero in the state shown in FIG. 8(a), {1/(2π)} (λ/m) is multiplied by the phase differences φ2 and φ1 measured above, and the resulting measurement values (initial values) P20 and P10 are incorporated into the stage controller 38.

The offset of the measurement values of the interferometers 87Y4 and 87Y3 is set at −P20 and −P10, respectively, by the stage controller 38, after which these offsets (−P20 and −P10) are added to the measurement values P2 and P1 supplied from the interferometers 87Y4 and 87Y3. These sums are termed the actual measurement values P2' and P1' of the interferometers 87Y4 and 87Y3. Specifically, these measurement values P2' and P1' accurately express the amount of displacement of the wafer stage WST in the Y direction from the above-mentioned initial state. The initial values of these measurement values (P20 and P10) are stored.

In FIG. 8(a), the wafer stage WST2 then moves further in the −X direction until it reaches the position shown in FIG. 8(b). In FIG. 8(b), the measurement beam 92Y4 of the interferometer 87Y4 has diverged from the reflective surface 85Y serving as the movable mirror. In this state, the Y coordinate of the wafer stage WST2 is measured by the interferometer 87Y3. The wafer stage WST2 begins moving back from this state toward the position shown in FIG. 8(a) in +X direction, and when the reflective surface 85Y enters the illumination range (measurement range) of the measurement beam 92Y4 of the interferometer 87Y4, the measurement value of the interferometer 87Y4 is set (preset) as follows.

First, the angle of rotation θW2 (a tiny amount (rad) substantially close to zero) of the wafer stage WST2 is measured by the measurement beam 92X5 (two laser beams) of the X axis interferometer 87X5. In this state, the measurement value P1 of the Y coordinate is found for the interferometer 87Y3 that uses the measurement beam 92Y3 in FIG. 8(a). This measurement value P1 is the direct measurement value prior to offset correction, however. Then, the stage controller 38, for example, finds an estimate of the fraction ε2/(2π) and the degree of interference N2 (N2 is an integer) for the interferometer 87Y4 from this measurement value P1. This fraction ε2 corresponds to the above-mentioned φ2.

Specifically, the operator in the stage controller 38 calculates an estimate P2' of the measurement value P2 of the interferometer 87Y4 before offset correction as follows from the spacing DX2 of the measurement beams 92Y3 and 92Y4, the measured angle of rotation θW2 of the wafer stage WST2, and the difference in the initial values of the measurement value P1 of the interferometer 87Y3 and the measurement values of the interferometers 87Y4 and 87Y3 (=P20−P10).

$$P2'=P1+DX2\cdot\theta W2+(P20-P10)$$

For example, when the measurement precision of the angle of rotation θW2 is high, this estimated value P2' may be preset directly as the current measurement value P2 of the interferometer 87Y4. However, the measurement value θW2 includes a certain amount of measurement error, so the fact that the interferometer 87Y4 can measure the absolute position in units of width λ/m is utilized, and the operator breaks down the indicated value P2' into the integer component and the fraction component. Therefore, the remainder of N2 times the length λ/m in the estimated value P2' of the measurement value of the interferometer 87Y4 becomes the fraction ε2/(2π). Specifically, the stage controller 38 calculates (estimates) the integer N2 and the fraction ε2 as follows.

$$N2=g\{P2'/(\lambda/m)\} \quad (1)$$

$$\epsilon2=\{P2'/(\lambda/m)-N2\}(2\pi) \quad (2)$$

Here, g{X} is a function that gives the maximum integer which does not exceed X. As will be discussed in detail below, the stage controller 38 determines the preset value of the integer (degree) N2 of the interferometer 87Y4 from the estimated degree of interference and fraction (N2 and ε2) obtained from the measurement value P1, and the phase difference (absolute phase) φ2 actually measured with the interferometer 87Y4.

Figure 9:
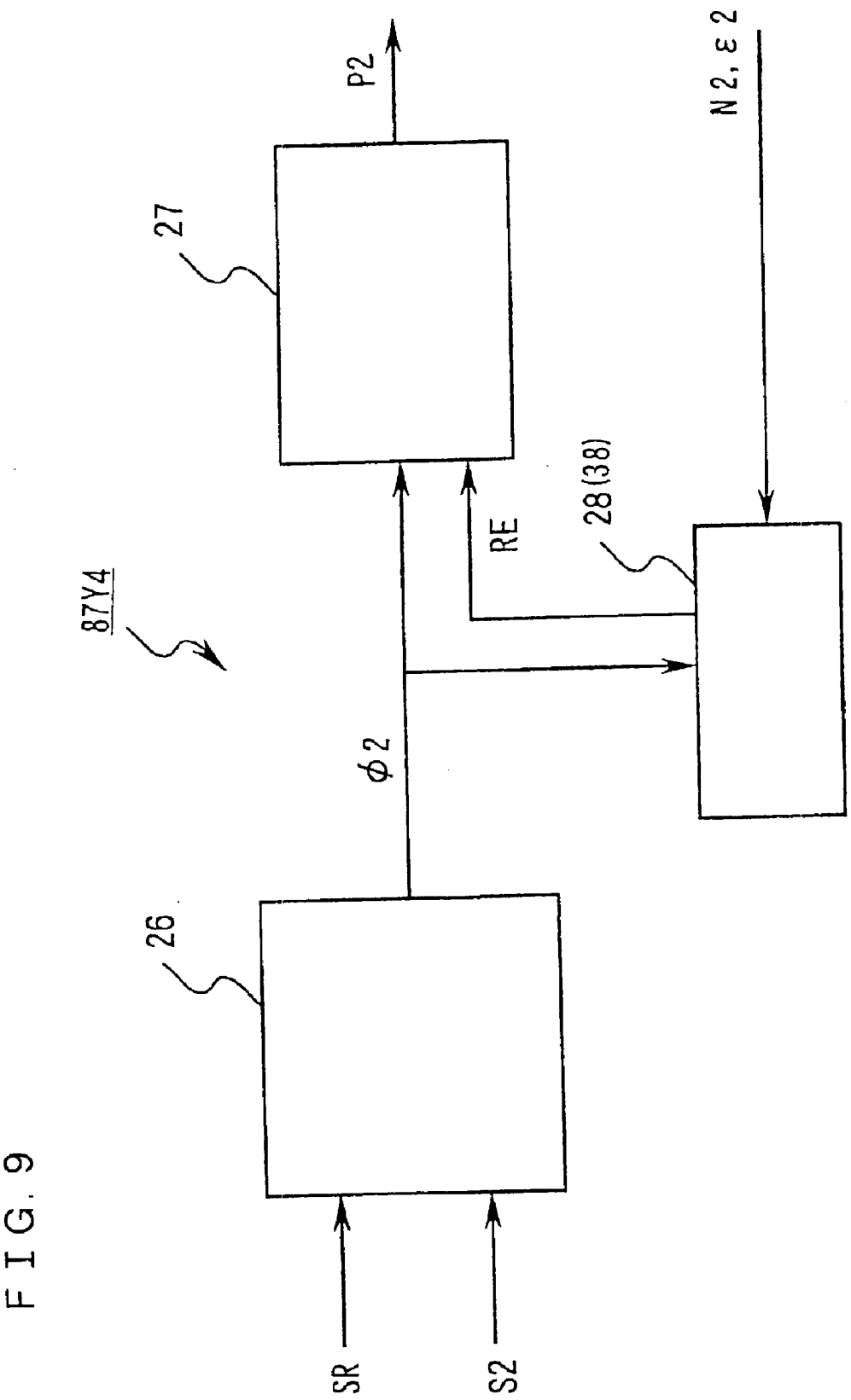
FIG. 9 is a diagram illustrating the simplified structure of part of the signal processing system used in the interferometer system of the second embodiment of the present invention.

FIG. 9 shows part of the stage controller 38 and part of the interferometer 87Y4 in this example. As shown in FIG. 9, the interferometer 87Y4 has a phase comparator 26 into which are inputted, for example, the reference signal SR and measurement signal S2 (photoelectrically converted signal for the interference light between the measurement beam and the reference beam) outputted from the laser light source. The phase comparator 26 detects the phase difference φ2 between the reference signal SR and the measurement signal S2, and the detected phase difference φ2 is outputted to the integrator 27, and is also outputted to a calculation processor 28 in the stage controller 38. The other interferometers are also equipped with their own phase comparator 26 and integrator 27.

During measurement, the integrator 27 integrates the integer N2 from the change in the phase difference $\phi 2$ as above, multiplies $\lambda/m$ by $\{N2+\phi 2/(2\pi)\}$, and outputs the measurement value P2 thus obtained to the stage controller 38 as information indicating the amount of movement of a movable mirror (the reflective surface 85Y in this example). However, when the transfer of measurement values is carried out as it is here, the calculation processor 28 compares the phase difference $\phi 2$ inputted from the phase comparator 26 with the estimated fraction $\epsilon 2$ inputted from the above-mentioned operator. If the estimated value $\epsilon 2$ of the estimated phase difference is close to $2\pi$ or 0 (zero), it is possible that the integer N2 indicating the estimated degree of interference will be outside the range of ±1, so this comparison is performed to verify this. The operation of this comparison will be described through reference to FIG. 10. For the sake of convenience, the estimated value of N2 is given as the degree N in FIG. 10.

In FIGS. 10(a) to (c), the horizontal axis is the phase difference between the reference signal and the measurement signal, and in particular illustrates the phase difference for ranges of degree of interference of k=N−1, k=N, and k=N+1. The phase difference changes by $2\pi$ within one degree. FIG. 10(a) illustrates a case in which the absolute value of the difference between the actual phase difference $\phi 2$ and the estimated phase difference $\epsilon 2$ is less than $\pi$, or ($|\phi 2-\epsilon 2|<\pi$). In this case, as seen in the figure, the actual phase difference $\phi 2$ is within the degree N, so the degree of interference is N as estimated, and the preset value N' of the degree is equal to N. FIG. 10(b) illustrates a case in which the value obtained by subtracting the estimated phase difference $\epsilon 2$ from the actual phase difference $\phi 2$ is greater than $\pi$ ($\phi 2-\epsilon 2>\pi$). In this case, as seen in the figure, the actual phase difference $\phi 2$ is within the degree N−1, so the preset value N' is equal to N−1. FIG. 10(c) illustrates a case in which the value obtained by subtracting the estimated phase difference $\epsilon 2$ from the actual phase difference $\phi 2$ is less than $-\pi$ ($\phi 2-\epsilon 2<-\pi$). In this case, as seen in the figure, the actual phase difference $\phi 2$ is within the degree N+1, so the preset value N' is equal to N+1.

The calculation processor 28 outputs the preset value N' determined as above as the preset value RE to the integrator 27 in FIG. 9. The integrator 27 sets the preset value RE (that is, N') as the preset value of the integer N2, calculates the Y coordinate measurement value P2 as follows from the phase difference $\phi 2$ from the phase comparator 26 and the integer N', supplies this value P2 to the stage controller 38, and thereafter performs the ordinary measurement operation.

$$P2=(\lambda/m)\cdot N'+(\lambda/m)\{\phi 2/(2\pi)\} \quad (3)$$

As a result, the measurement value P2 of the interferometer 87Y4 ends up returning substantially to the original value, and the measurement value of the interferometer 87Y3 is accurately transferred to the interferometer 87Y4.

Thus, in this example, in setting the preset value for a first interferometer set up such that reflected light from a mirror surface is obtained again, a measurement value calculated from the measurement value of a second interferometer is utilized as an estimate for determining the degree of interference (N1 or N2) of the first interferometer, and the preset value of the degree of interference (N1 or N2) of this first interferometer, and in turn the preset value of the interferometer measurement value, are determined on the basis of the estimated degree of interference and the phase difference (absolute phase) $\phi$ measured with this first interferometer. Here, the degree of interference N1 or N2 is unknown since the measurement beam temporarily diverges from the mirror surface, but because the degree of interference can be found by calculation from the measurement value of another interferometer, the preset value for the interferometer can be set at the precision inherent in that interferometer.

If measurement error should creep into all of the measurement values at the start-up of the device or for one reason or another, making it necessary to reset the measurement values for all of the interferometers, then in FIG. 9 a degree of N2=0 must be sent to the calculation processor 28, and the output (preset value) RE(=0) of the calculation processor 28 must be set in the integrator 27. In this case, just the value corresponding to the phase difference (absolute phase) $\phi 2$ ends up being set in the integrator 27 (the interferometer 87Y4). Similarly, the initial value of the interferometer 87Y3 corresponds to the phase difference $\phi 1$.

The output P2 of the integrator 27 may also be fed back to the calculation processor 28 as necessary. If it is, then after the integrator 27 is reset, for instance, even the amount of displacement of the wafer stage up to the point when the reset value is set from the calculation processor 28 to the integrator 27 can be set in the integrator 27 as a reset value. Here, since the reflected light from the wafer stage can be received, the initial setting can be more precise, taking into account the amount of displacement of the wafer stage up to the point when the reset value RE is set in the integrator 27.

Also, in this example, one of the measurement beams of the interferometers 87Y3 to 87Y5 must be directed at the side surface 85Y of the wafer stage WST2 during the movement of the wafer stage WST2. Accordingly, in this example, the interferometers are laid out such that the spacing between the measurement beams (such as the spacing DX2 of the measurement beams 92Y3 and 92Y4 shown in FIG. 8) will be shorter than the width DX1 of the wafer stage WST2 in the X direction.

The setting of the initial values (preset values) of the interferometers is performed in the same manner for the interferometers 83X1 to 83X5 that are used to measure the positions of the reticle stages RST1 and RST2 in FIG. 6, and the transfer of measurement values is carried out on the basis of this setting.

A heterodyne interference type of laser interferometer is used in this example, but it should go without saying that the present invention is also applicable to measurement by fringe count method using a homodyne interference type of laser interferometer.

Figure 11:
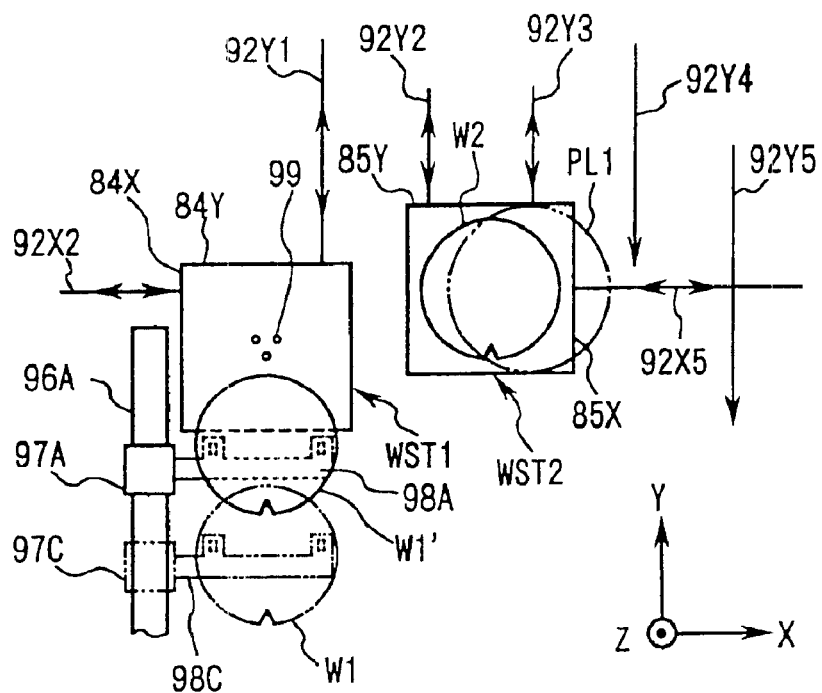
FIG. 11 is a plan view of the use of the two wafer stages WST1 and WST2 in the wafer exchange and alignment sequence and in the exposure sequence.

Next, with the projection exposure apparatus of this example, first and second conveyance systems for exchanging the wafers are provided between the wafer stages WST1 and WST2. The first conveyance system, as shown in FIG. 11, performs wafer exchange as discussed below for the wafer stage WST1 at a wafer loading position on the left side. This first conveyance system comprises a first center-up 99 consisting of three vertically moving members provided on the wafer stage WST1, and a first wafer loader including a first loading guide 96A extending in the Y axis direction, first and second sliders 97A and 97C that move along this first loading guide 96A, an unloading arm 98A attached to the first slider 97A, a loading arm 98C attached to the second slider 97C, and so forth.

The operation of exchanging wafers with this first conveyance system will be briefly described. As shown in FIG. 11, the description here is for a case in which a wafer W1' on the wafer stage WST1 at the wafer unloading position on the left side is exchanged with a wafer W1 that has been conveyed by the first wafer loader.

First, the main controller 90 turns off the vacuum chucking of the wafer holder (not shown) on the wafer stage WST1 to release the wafer W1'. Then, the main controller 90 raises the first center-up 99 a specific amount via a center-up drive system (not shown). This lifts the wafer W1' up to the required height. In this state the main controller 90 moves the unloading arm 98A directly under the wafer W1' by means of the wafer loading controller (not shown). In this state the main controller 90 lowers the first center-up 99 to a specific position and transfers the wafer W1' to the unloading arm 98A, after which the vacuum chucking of the unloading arm 98A is commenced. Next, the main controller 90 sends the wafer loading controller a command to start retracting the unloading arm 98A and moving the loading arm 98C. This starts the unloading arm 98A moving in the −Y direction in FIG. 11, and when the loading arm 98C holding the wafer W1 is over the wafer stage WST1, the vacuum chucking of the loading arm 98C by the wafer loading controller is released, and the first center-up 99 is then raised so that the wafer W1 is transferred onto the wafer stage WST1.

Figure 12:
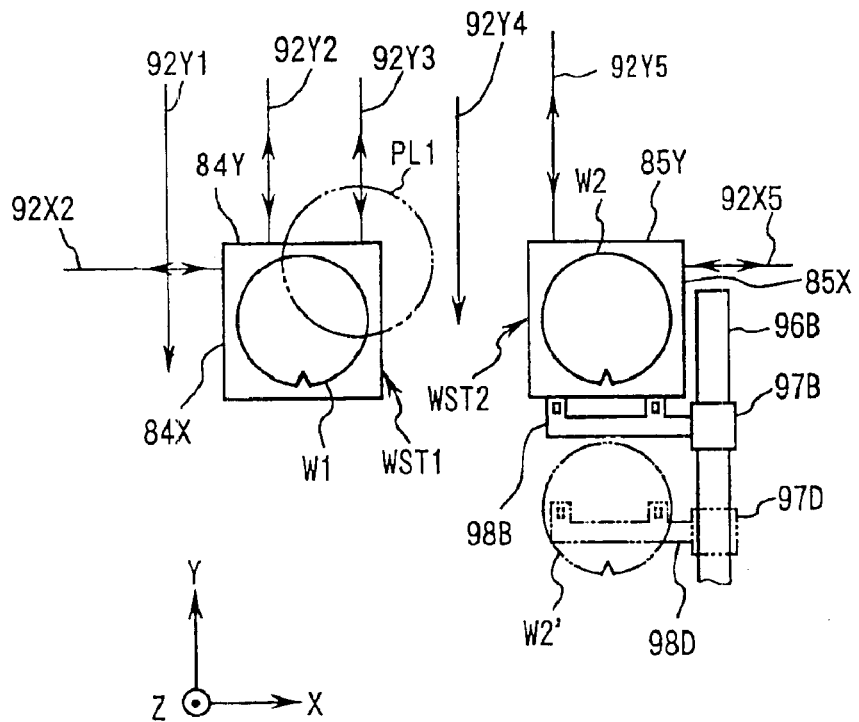
FIG. 12 illustrates the switching between the wafer exchange and alignment sequence and exposure sequence in FIG. 11.

As shown in FIG. 12, the second conveyance system, which transfers wafers to and from the wafer stage WST2, is symmetrical to the first conveyance system, and comprises a second loading guide 96B, third and fourth sliders 97B and 97D that move along this 96b, an unloading arm 98B attached to the third slider 97B, a loading arm 98D attached to the fourth slider 97D, and so forth. The wafer W2' to be exposed next is held by the loading arm 98D.

Parallel processing using the two wafer stages WST1 and WST2 of the projection exposure apparatus of this example will now be described through reference to FIGS. 11 and 12.

FIG. 11 is a plan view of the state in which wafer exchange is performed between the wafer stage WST1 and the first conveyance system as described above while the wafer W2 on the wafer stage WST2 is being exposed by the projection optical system PL1. In this case, an alignment operation is performed on the wafer stage WST1 as discussed below immediately after the wafer exchange. In FIG. 11, the position of the wafer stage WST2 during the exposure operation is controlled on the basis of the measurement values of the measurement beams 92X5 and 92Y3 of the interferometer system, and the position of the wafer stage WST1 where the wafer exchange and alignment operations are being carried out is controlled on the basis of the measurement values of the measurement beams 92X2 and 92Y1 of the interferometer system. Accordingly, the main controller 90 in FIG. 5 sends a command to the stage controller 38 to execute the initial setting (presetting) of the above-mentioned measurement values of the interferometers prior to the wafer exchange and alignment operations.

Wafer exchange and the setting of the initial values of the interferometers are followed by search alignment. Search alignment performed after wafer exchange consists of prealignment that is performed again on the wafer stage WST1 because the positional error is still large with just the prealignment performed during the conveyance of the wafer W1. In more specific terms, the positions of three search alignment marks (not shown) formed on the wafer W1 placed on the wafer stage WST1 are measured using the LSA sensors or the like of the alignment system 88A in FIG. 5, and the wafer W1 is positioned in the X, Y, and θ directions on the basis of these measurement results. The operation of the various components in this search alignment is controlled by the main controller 90.

Upon completion of this search alignment, fine alignment is performed, in which the layout of the various shot regions on the wafer WI is determined, by EGA (Enhanced Global Alignment) in this case. More specifically, while managing the position of the wafer stage WST1, the interferometer system (measurement beams 92X2 and 92Y1) use the FIA sensors or the like of the alignment system 88A in FIG. 5 to measure the alignment mark positions of a specific shot region (sample shot) on the wafer W1 while also successively moving the wafer stage WST1 on the basis of the designed shot layout data (alignment mark position data), and all of the shot layout data are calculated by statistical computation by least squares method on the basis of this measurement result and the designed coordinate data for shot layout. The operation of the various components in this EGA fine alignment is controlled by the main controller 90, and the above-mentioned computation is performed by the main controller 90.

While the wafer exchange and alignment operations are being performed on the wafer stage WST1 side, double exposure is performed on the wafer stage WST2 side by continuous step-and-scan method using two reticles R1 and R2 and while varying the exposure conditions.

In specific terms, fine alignment is carried out by EGA ahead of time just as on the wafer W1 side as discussed above, and the shot regions on the wafer W2 are successively moved under the optical axis of the projection optical system PL1 on the basis of the shot layout data for the wafer W2 thus obtained, after which scanning exposure is performed by the synchronous scanning of the reticle stage RST1 (or RST2) and the wafer stage WST2 in FIG. 6 in the scanning direction every time a shot region is exposed. This exposure of all the shot regions on the wafer W2 is carried out continuously, even after reticle exchange. The specific exposure procedure in double exposure is as follows. The various shot regions on the wafer W2 are successively subjected to scanning exposure using the reticle R2, after which the reticle stages RST1 and RST2 are moved a specific amount in the +Y direction to set the reticle R1 at the approach starting position, after which scanning exposure is performed. Here, the exposure conditions (the illumination conditions such as zonal illumination or deformation illumination, the amount of exposure light, etc.) are different for the reticle R2 and the reticle R1, so the conditions must be altered ahead of time according to the exposure data and so forth. The operation of the various components during this double exposure of the wafer W2 is also controlled by the main controller 90.

When the above-mentioned exposure sequence and the wafer exchange and alignment sequence are performed in parallel on the two wafer stages WST1 and WST2 shown in FIG. 11, the wafer stages, which are finished first, enter a stand-by state, and at the point when both operations are complete, the wafer stages WST1 and WST2 are moved to the position shown in FIG. 12. Wafer W2, which has undergone the exposure sequence on the wafer stage WST2, is exchanged for another wafer at the loading position on the right side, and the wafer W1, which has undergone the alignment sequence on the wafer stage WST1, is subjected to the exposure sequence under the projection optical system PL1. The above-mentioned wafer exchange operation and alignment sequence are carried out at the loading position on the right side in FIG. 12 in the same manner as at the loading position on the left side.

Thus, in this example, while the two wafer stages WST1 and WST2 are independently moved two-dimensionally, the wafers W1 and W2 on these wafer stages are subjected to the exposure sequence and the wafer exchange and alignment sequence in parallel, and this increases throughput. However, when two wafer stages are used to perform two operations in parallel, the operations conducted on one of the wafer stages can sometimes become a source of disturbance and affect the operations conducted on the other wafer stage. On the other hand, there are also operations conducted on one of the wafer stages that do not affect the operations conducted on the other wafer stage. In view of this, in this example, the operations that are performed in parallel are divided into operations that become a source of disturbance and operations that do not, and the various operations are timed so that operations that become a source of disturbance, or operations that do not become a source of disturbance, are performed at the same time.

For instance, during scanning exposure, in addition to ensuring that the synchronous scanning of the wafer W1 and the reticles R1 and R2 at the same speed does not become a source of disturbance, every effort must also be made to eliminate other sources of disturbance. Accordingly, the scanning exposure over one of the wafer stages WST1 is timed so that the alignment sequence performed on the wafer W2 of the other wafer stage WST2 will be in a stationary state during this period. Specifically, measurement in the alignment sequence is performed with the wafer stage WST2 stationary, so it is not a source of disturbance for the scanning exposure, allowing mark measurement to be performed in parallel during scanning exposure. Meanwhile, the alignment sequence involves uniform motion during scanning exposure, so there is no disturbance and high-precision measurement is possible.

The same is possible during wafer exchange. In particular, vibration and the like produced when a wafer is transferred from a loading arm to a center-up can become a source of disturbance, so the transfer of wafers may be matched to the acceleration and deceleration (which are sources of disturbance) before scanning exposure or before and after synchronous scanning. This timing is performed by the main controller 90.

Furthermore, in this example higher resolution and greater DOF (depth of focus) are obtained because double exposure is performed using a plurality of reticles. This double exposure method, however, requires that the exposure step be repeated at least two times, so when a single wafer stage is used, there is a marked drop in throughput because exposure takes longer. Using a projection exposure apparatus equipped with two wafer stages as in this example, however, greatly improves throughput, and higher resolution and greater DOF (depth of focus) are also achieved.

The scope of the present invention is not limited to this, and the present invention can also be applied favorably when exposure is effected by single exposure method. Using two wafer stages allows the throughput to be nearly doubled over that when single exposure is performed using just one wafer stage.

In this second embodiment, a measurement stage for measuring the state of the exposure light or the imaging characteristics may be further provided as in the first embodiment. In this example the wafer stages are driven by a combination of one-dimensional motors, but they may also be driven two-dimensionally by a planar motor as in the first embodiment.

The projection exposure apparatus of this embodiment can be manufactured by assembling the reticle stages RST (RST1 and RST2) and the wafer stages WST (WST1 and WST2), which consist of numerous mechanical parts, optically adjusting the projection optical system PL (PL1), which is made up of a plurality of lenses, and then making overall adjustments (electrical adjustments, operation checks, etc.).

The projection exposure apparatus is preferably manufactured in a clean room where temperature, cleanliness, and so forth are managed.

In the above embodiments the present invention was applied to a step-and-scan type of projection exposure apparatus, but the present invention is not limited to this, and can be similarly applied to a step-and-repeat type of projection exposure apparatus, a proximity type of exposure apparatus, an exposure apparatus in which EUV light such as X rays is used as the exposure beam, or a charged particle beam exposure apparatus in which an electron beam (energy beam) is used as the light source (energy beam). Nor is the invention limited to an exposure apparatus, and an inspection apparatus, repair apparatus, or the like that uses stages to position wafers or the like may be used instead.

Applications of the exposure apparatus are not limited to an exposure apparatus used for manufacturing semiconductors, and the present invention can be applied to a wide range of apparatus, such as a liquid crystal exposure apparatus for exposing a square glass plate in a liquid crystal display element pattern, or an exposure apparatus for manufacturing thin film magnetic heads.

Also, when linear motors are used for the wafer stages or reticle stages, the movable stages may be supported by any method, such as air levitation using air bearings, or magnetic levitation. The repulsive force generated by the movement of the wafer stage here, for example, may be mechanically diverted to the floor (ground) using a frame member as discussed in Japanese Patent Application Laid-Open No. 8-166475 (U.S. Pat. No. 5,528,118). Meanwhile, the repulsive force generated by the movement of the reticle stage may be mechanically diverted to the floor (ground) using a frame member as discussed in Japanese Patent Application Laid-Open No. 8-330224 (U.S. patent application Ser. No. 08/416,558). These repulsive forces may also be canceled out by a counterbalance system using the law of conservation of momentum.

When a semiconductor device is manufactured on a wafer using the exposure apparatus in one of the above embodiments, this semiconductor device is manufactured by a method including a step in which the functions and performance of the device are designed, a step in which a reticle is manufactured on the basis of the first step, a step in which a wafer is fabricated from a silicon material, a step in which the wafer is exposed in the pattern of the reticle with the exposure apparatus in one of the above embodiments, a device assembly step (including die sinking, bonding, and packaging), an inspection step, and so forth.

Finally, the present invention is not limited to the above embodiments, and can of course have a variety of structures without exceeding the essence of the present invention. Also, all of the contents disclosed in Japanese Patent Application 9-364493, filed on Dec. 18, 1997, and Japanese Patent Application 10-339789, filed on Nov. 30, 1998, including the Specification, Claims, Drawings, and Abstract, are quoted essentially verbatim and are incorporated hereinto by reference.

With the first stage device of the present invention, a movable stage is provided for each individual function or for each of a specific plurality of function groups, which allows each movable stage to be more compact and to be driven faster and more precisely. Also, a plurality of movable stages can each be moved over a range larger than the measurement range of a first measurement system, and when each movable stage enters the measurement range of this first measurement system, the position of that movable stage can be measured by the first measurement system at high precision and with good reproducibility.

With the second stage device of the present invention, the positions of a plurality of movable stages can be measured over a wide measurement range, at high precision, and with good reproducibility. Throughput is also increased because the positions of the movable stages can be measured at high precision by the first measurement system merely by matching the measurement result of the first measurement system to the measurement result of the second measurement system.

The first exposure apparatus of the present invention is equipped with the stage device of the present invention, so when the position of the movable stage thereof is measured by an interferometer, for example, the movable mirror can be made smaller than the range of movement of this movable stage, and the weight of this movable stage can be reduced. It is therefore easier to move this movable stage at high speed, exposure can be performed at a high throughput using a double exposure method or the like, and better resolution and depth of focus can be achieved.

With the second exposure apparatus of the present invention, only the minimum functions required for exposure are given to a first movable stage that is used for the original purpose of exposure, and this allows the size of this first movable stage to be kept to the required minimum, so the stage can be more compact and lightweight, and throughput is increased. Meanwhile, characteristic measurement apparatus for measuring the characteristics in the transfer of the mask pattern, which are not directly required for exposure, are mounted on a second movable stage, allowing characteristics to be measured in the transfer of the mask pattern. Also, because this exposure apparatus is equipped with the stage device of the present invention, the positions of its plurality of movable stages can be measured at high precision.

With the third exposure apparatus of the present invention, one of a plurality of movable stages can be used to perform an exposure operation while another movable stage handles the conveyance and alignment of the substrates, which increases throughput.

With the fourth exposure apparatus of the present invention, only the minimum functions required for exposure are given to a first movable stage that is used for the original purpose of exposure, and this allows this first movable stage to be more compact and lightweight, and throughput is increased. Meanwhile, characteristic measurement apparatus for measuring the imaging characteristics of the projection optical system, which are not directly required for exposure, are mounted on a second movable stage, allowing imaging characteristics to be measured.

With the first positioning method of the present invention, the positions of a plurality of movable stages are measured and the stages positioned quickly and at high precision. Similarly, with the second positioning method of the present invention, the positions of a plurality of movable stages are measured and the stages positioned quickly and at high precision.

With the third stage device of the present invention, positions can be measured at high precision by interferometer method over a range that is wider than the width of the movable mirror (or an equivalent mirror surface), and as a result, the moving components (movable stages) can be more compact. An exposure apparatus equipped with this third stage device can drive a movable stage at a high speed, so the throughput of the exposure step is increased.

A method for manufacturing a device using the above-mentioned exposure apparatus of the present invention allows a high-function semiconductor device or the like to be mass produced at a high throughput.

What is claimed is:

1. A stage device, comprising:
   a plurality of movable stages disposed on a certain movement plane so as to be movable independently of each other;
   a first measurement system which measures within a predetermined measurement range a position of one of the plurality of movable stages; and
   a second measurement system which measures an amount of positional deviation of each of the plurality of movable stages from a predetermined reference position within the predetermined measurement range, or a degree of coincidence of each of the plurality of movable stages with respect to the reference position, the second measurement system measuring the amount of positional deviation or the degree of coincidence along a first direction that is perpendicular to the certain movement plane;
   wherein a measurement value obtained with the first measurement system is corrected on the basis of a measurement result of the second measurement system.

2. An exposure apparatus provided with the stage device according to claim 1, wherein masks on which mutually different patterns are formed are placed on the plurality of movable stages of the stage device, and the patterns of the masks on the plurality of movable stages are alternately transferred onto a substrate while being positioned.

3. An exposure apparatus provided with the stage device according to claim 1, wherein a mask is placed on a first movable stage among the plurality of movable stages of the stage device, a characteristic measurement apparatus which measures characteristics in transfer of a pattern of the mask is placed on a second movable stage of the plurality of movable stages, and the pattern of the mask is transferred onto a substrate.

4. An exposure apparatus provided with the stage device according to claim 1, wherein a substrate is placed on each of the plurality of movable stages of the stage device, and the plurality of substrates are alternately exposed with mask patterns while the plurality of movable stages are alternately positioned at an exposure position.

5. An exposure apparatus provided with the stage device according to claim 1 and a projection optical system,
   wherein a substrate is placed on a first movable stage of the plurality of movable stages of the stage device, a characteristic measurement apparatus which measures imaging characteristics of the projection optical system is placed on a second movable stage of the plurality of movable stages, and the substrate on the first movable stage is exposed with a mask pattern via the projection optical system.

6. A positioning method that makes use of the stage device according to claim 1, wherein when one of the plurality of movable stages enters the measurement range of the first measurement system, the amount of positional deviation of the one movable stage from the reference position within the measurement range, or the degree of coincidence of the one movable stage with respect to the reference position, is measured by the second measurement system, and a measurement value obtained with the first measurement system is corrected on the basis of a measurement result of the second measurement system.

7. A scanning exposure apparatus, comprising:

a reticle stage which is movable and holds a mask having a pattern;

a first movable stage disposed in a certain movement plane, the first movable stage holding a first substrate on a first holding surface and having a first reflective member on a first side surface of the first movable stage which is perpendicular to the first holding surface;

a second movable stage disposed in the certain movement plane so as to be movable independently from the first movable stage, the second movable stage holding a second substrate on a second holding surface and having a second reflective member on a second side surface of the second movable stage which is perpendicular to the second holding surface;

a scanning system which scans one of the first and second movable stages and the reticle stage along a scanning axis;

a first measurement system which measures within a first measurement range a position of one of the first and second movable stages, the first measurement system being capable of emitting a measurement beam to a mirror of each of the first and second movable stages;

a second measurement system which measures positions of the first and second movable stages within a second measurement range partially overlapping the first measurement range; and a control system which corrects measurement results of the first and second measurement systems on the basis of the measurement results of the first and second measurement systems.

8. The scanning exposure apparatus according to claim 7, wherein the first measurement system emits biaxial beams spaced apart in a direction perpendicular to the certain movement plane.

9. The scanning exposure apparatus according to claim 8, wherein the second measurement system emits biaxial beams spaced apart in a direction perpendicular to the certain movement plane.

10. The scanning exposure apparatus according to claim 7, wherein the second measurement system emits biaxial beams spaced apart in a direction perpendicular to the certain movement plane.

11. The scanning exposure apparatus according to claim 7, wherein the first measurement system emits the measurement beam along the scanning axis.

12. The scanning exposure apparatus according to claim 8, wherein the first measurement system emits the biaxial beams along the scanning axis.

13. The scanning exposure apparatus according to claim 9, wherein the second measurement system emits the biaxial beams along the scanning axis.

14. The scanning exposure apparatus according to claim 10, wherein the second measurement system emits the biaxial beams along the scanning axis.

15. The scanning exposure apparatus according to claim 7, wherein the first movable stage and the second movable stage are moved by a planar motor.

16. A stage device comprising:

a first movable stage having a first reflective member and a first reference mark;

a second movable stage having a second reflective member and a second reference mark;

an interferometer system which cooperates with the first and second reflective members to detect a position of the first and second movable stages alternately;

an optical sensor which detects the first and second reference marks alternately; and a controller which corrects an output of the interferometer system in accordance with a detection result of the optical sensor when the interferometer system detects switching between the position of the first movable stage and the position of the second movable stage.

17. The stage device according to claim 16, wherein the first and second movable stages are disposed on a common base.

18. The stage device according to claim 16, wherein the first reference mark is located on a first holding surface of the first movable stage and the first reflective member is provided on a first side surface perpendicular to the first holding surface.

19. The stage device according to claim 18, wherein the second reference mark is located on a second holding surface of the second movable stage and the second reflective member is provided on a second side surface perpendicular to the second holding surface.

20. A scanning exposure apparatus, comprising:

a first movable stage disposed in a certain movement plane, the first movable stage holding a first substrate on a first holding surface and having a first reflective member on a first side surface of the first movable stage which is perpendicular to the first holding surface;

a second movable stage disposed in the certain movement plane so as to be movable independently from the first movable stage, the second movable stage holding a second substrate on a second holding surface and having a second reflective member on a second side surface of the second movable stage which is perpendicular to the second holding surface;

a planar motor which moves the first and second movable stages;

a first measurement system which measures within a first measurement range a position of the first and second movable stages, the first measurement system being capable of emitting a measurement beam to each of the first and second reflective members;

a second measurement system which measures positions of the first and second movable stages within a second measurement range partially overlapping the first measurement range; and a control system which corrects measurement results of the first and second measurement system on the basis of the measurement results of the first and second measurement systems.

* * * * *

UNITED STATES PATENT AND TRADEMARK OFFICE
CERTIFICATE OF CORRECTION

PATENT NO. : 6,897,963 B1
DATED : May 24, 2005
INVENTOR(S) : Tetsuo Taniguchi and Saburo Kamiya It is certified that error appears in the above-identified patent and that said Letters Patent is hereby corrected as shown below:

Title page,
Item [56], Inventors, please add the following:
-- [56] References Cited
    U.S. PATENT DOCUMENTS
  5,715,064    2/1998        Lin --.

Signed and Sealed this

Thirteenth Day of September, 2005

JON W. DUDAS
*Director of the United States Patent and Trademark Office*